(12) United States Patent
Chen et al.

(10) Patent No.: US 10,658,813 B2
(45) Date of Patent: May 19, 2020

(54) LOW DIVERGENCE HIGH BRIGHTNESS BROAD AREA LASERS

(71) Applicant: nLIGHT, Inc., Vancouver, WA (US)

(72) Inventors: Zhigang Chen, Portland, OR (US); Manoj Kanskar, Portland, OR (US)

(73) Assignee: nLIGHT, Inc., Vancouver, WA (US)

( * ) Notice: Subject to any disclaimer, the term of this patent is extended or adjusted under 35 U.S.C. 154(b) by 0 days.

(21) Appl. No.: 16/001,734

(22) Filed: Jun. 6, 2018

(65) Prior Publication Data

US 2018/0358777 A1    Dec. 13, 2018

Related U.S. Application Data

(60) Provisional application No. 62/517,332, filed on Jun. 9, 2017.

(51) Int. Cl.
*H01S 5/026* (2006.01)
*G02B 27/09* (2006.01)
(Continued)

(52) U.S. Cl.
CPC .............. *H01S 5/026* (2013.01); *G02B 6/122* (2013.01); *G02B 27/0977* (2013.01);
(Continued)

(58) Field of Classification Search
CPC ...... H01S 5/026; H01S 5/1014; H01S 5/2036; H01S 5/0014; H01S 5/0265;
(Continued)

(56) References Cited

U.S. PATENT DOCUMENTS

| 4,694,459 A | * | 9/1987 | Burnham | ............ | H01S 5/06255 |
| | | | | | 372/45.01 |
| 6,014,396 A | * | 1/2000 | Osinski | ..................... | H01S 5/10 |
| | | | | | 372/45.01 |

(Continued)

FOREIGN PATENT DOCUMENTS

| JP | H0823133 | 1/1996 |
| WO | WO 2004/038459 | 5/2004 |

OTHER PUBLICATIONS

Agrawal, "Lateral Analysis of Quasi-Index-Guided Injection Lasers: Transition from Gain to Index Guiding," *Journal of Lightwave Technology*, LT-2(4):537-543 (Aug. 1984).
(Continued)

*Primary Examiner* — Armando Rodriguez
(74) *Attorney, Agent, or Firm* — Klarquist Sparkman, LLP

(57) ABSTRACT

Apparatus comprise a semiconductor waveguide extending along a longitudinal axis and including a first waveguide section and a second waveguide section, wherein a lateral refractive index difference defining the semiconductor waveguide is larger for the first waveguide section than for the second waveguide section, and an output facet situated on the longitudinal axis of the semiconductor waveguide so as to emit a laser beam propagating in the semiconductor waveguide, wherein the first waveguide section is situated between the second waveguide section and the output facet and wherein the lateral refractive index difference suppresses emission of higher order transverse modes in the laser beam emitted by the output facet.

29 Claims, 15 Drawing Sheets

(51) Int. Cl.
*G02B 6/122* (2006.01)
*H01S 5/20* (2006.01)
*H01S 5/10* (2006.01)
*G02B 6/12* (2006.01)
*H01S 5/22* (2006.01)
*H01S 5/00* (2006.01)
*H01S 5/12* (2006.01)
*H01S 5/40* (2006.01)
*H01S 5/028* (2006.01)

(52) U.S. Cl.
CPC .......... *H01S 5/1014* (2013.01); *H01S 5/2036* (2013.01); *G02B 2006/12104* (2013.01); *H01S 5/0014* (2013.01); *H01S 5/0265* (2013.01); *H01S 5/0287* (2013.01); *H01S 5/1003* (2013.01); *H01S 5/1203* (2013.01); *H01S 5/22* (2013.01); *H01S 5/4043* (2013.01); *H01S 2301/166* (2013.01); *H01S 2301/185* (2013.01)

(58) Field of Classification Search
CPC .... H01S 5/0287; H01S 5/1003; H01S 5/1203; H01S 5/22; H01S 5/4043; H01S 5/166; H01S 5/185; H01S 5/122; H01S 5/0977
See application file for complete search history.

(56) References Cited

U.S. PATENT DOCUMENTS

| | | | |
|---|---|---|---|
| 6,668,001 | B2 | 12/2003 | Ohkubo |
| 7,218,809 | B2 | 5/2007 | Zhou et al. |
| 7,602,828 | B2 | 10/2009 | Rossin et al. |
| 2001/0021213 | A1* | 9/2001 | Lee .......................... H01S 5/10 372/46.01 |
| 2014/0301421 | A1 | 10/2014 | Kanskar |

OTHER PUBLICATIONS

International Search Report and Written Opinion for related International Application No. PCT/US2018/036534, 8 pages, dated Oct. 25, 2018.

* cited by examiner

LOW DIVERGENCE HIGH BRIGHTNESS BROAD AREA LASERS

CROSS REFERENCE TO RELATED APPLICATION

This application claims the benefit of U.S. provisional application No. 62/517,332, filed Jun. 9, 2017, which is incorporated by reference herein.

FIELD

The field pertains to semiconductor waveguides and broad area lasers.

BACKGROUND

Multimode broad area semiconductor laser diodes (BALs) typically emit beams having a higher slow-axis beam-parameter-product (BPP) and a lower slow axis brightness (power/BPP$^2$) than beams emitted by similar single-mode semiconductor laser diodes. The poorer slow axis beam quality of the beams emitted by the BALs can be a result of a larger slow axis divergence and an associated lateral shape of the multiple optical modes in the emitted beams. Reducing the width of the emitters of the BALs can improve brightness, but output power typically suffers. Therefore, devices and methods are needed to provide BALs with improved slow-axis performance at higher powers.

SUMMARY

According to some examples of the disclosed technology, apparatus comprise a semiconductor waveguide extending along a longitudinal axis and including a first waveguide section and a second waveguide section, wherein a lateral refractive index difference defining the semiconductor waveguide is larger for the first waveguide section than for the second waveguide section, and an output facet situated on the longitudinal axis of the semiconductor waveguide so as to emit a laser beam propagating in the semiconductor waveguide, wherein the first waveguide section is situated between the second waveguide section and the output facet and wherein the lateral refractive index difference suppresses emission of higher order transverse modes in the laser beam emitted by the output facet. In some embodiments, the lateral refractive index difference of at least a portion of the first waveguide section defines a lateral index-guiding region and the lateral refractive index difference of at least a portion of the second waveguide section defines a lateral gain-guiding region or a lateral weak index-guiding region. In some examples, the lateral refractive index difference in the first waveguide section is constant or decreases monotonically and the lateral refractive index difference in the second waveguide section is constant or decreases monotonically. According to some laser diode examples, a high reflector facet is provided opposite the output facet, wherein the output facet is a partial reflector facet so as to define a laser oscillator between the high reflector facet and the partial reflector facet. In some examples, the first waveguide section adjoins the partial reflector and the lateral refractive index difference of the first waveguide section defines an index-guiding region, and the second waveguide section adjoins the high reflector and the lateral refractive index difference of the second waveguide section defines a gain-guiding region. In additional examples, a lateral width of the semiconductor waveguide tapers in a direction away from the output facet along the longitudinal axis. In some apparatus examples, the lateral refractive index difference corresponds to a lateral refractive index profile including a middle refractive index portion corresponding to an interior region of the semiconductor waveguide and opposite side refractive index portions corresponding to opposite lateral regions adjacent to the interior region. According to some examples, the refractive index profile is defined by a ridge structure. In some examples, the opposite lateral regions include index elements that extend longitudinally along the semiconductor waveguide adjacent to the interior region and so as to define the side refractive index regions. The index elements can comprise air, dielectric, or semiconductor material, in different examples. In some embodiments, the index elements are curved such that a first length portion further from the output facet along the longitudinal axis is more spaced apart from the longitudinal axis than a second length portion that is closer to the output facet along the longitudinal axis. In some examples, the curving defines a waveguide section situated to provide an adiabatic transition between index-guiding and gain-guiding. In further examples, the index elements extend longitudinally adjacent to the interior region of the first waveguide section and do not extend longitudinally adjacent to the interior region of the second waveguide section. According to some embodiments, the index elements in at least a portion of the first waveguide section include an etch depth at or below a lateral emission axis of the emitted laser beam. In some examples, the index elements include an etch depth that decreases with increasing distance from the output facet along the longitudinal axis. In some embodiments, the index elements include a longitudinally varying width that is associated with the decrease of the etch depth. In some laser diode examples, apparatus further comprise a high reflector facet opposite the output facet so as to define a laser oscillator between the high reflector facet and the output facet, and index elements situated opposite an interior region of the semiconductor waveguide and extending longitudinally along and adjacent to the semiconductor waveguide with an etch depth that varies from a first depth at the output facet to a second depth smaller than the first depth, and which can include a zero depth, at the high reflector so as to define opposite lateral side refractive index portions of the lateral refractive index difference. In some apparatus examples, the refractive index difference varies at a cross-section of the semiconductor waveguide based on an amount of current injection through the semiconductor waveguide at the cross-section. In further apparatus examples, the semiconductor waveguide is a master oscillator power amplifier (MOPA) with the first waveguide section corresponding to the power amplifier of the MOPA and the second waveguide section corresponding to the master oscillator of the MOPA. In additional apparatus examples, the first waveguide section includes at least a portion with a lateral width that tapers in a direction away from the output facet along the longitudinal axis, and the second waveguide section includes at least a portion having a constant lateral width along the longitudinal axis so as to define a single or few lateral transverse mode waveguide. In additional examples, apparatus further comprise a second semiconductor waveguide monolithically spaced apart from the semiconductor waveguide in a semiconductor growth direction so as to define a multijunction diode laser. In some multijunction diode laser examples, a first pair of refractive index elements is adjacent to the semiconductor waveguide so as to provide the lateral refractive index difference and a second pair of refractive index elements is adjacent to the second semiconductor waveguide so as to provide a second lateral refractive index difference that also suppresses emission of higher order transverse modes in a laser beam emitted from the second semiconductor waveguide. In additional multijunction diode laser examples, a pair of lateral refractive index elements extend in the semiconductor growth direction so as to be situated adjacent to the semiconductor waveguide and the second semiconductor waveguide and so as to provide the lateral refractive index difference.

According to some examples of the disclosed technology, a semiconductor laser includes a high reflector and a partial reflector, a gain guided region proximate the high reflector that suppresses lateral higher order modes, and an index guided region proximate the partial reflector facet that supports the lateral higher modes suppressed by the gain guided region.

According to further examples, methods comprising forming a semiconductor laser including a plurality of semiconductor layers such that a lateral refractive index difference varies along a length of the semiconductor laser so as to define a lateral index-guided region nearer to an output facet of the semiconductor laser and a lateral gain-guided region nearer to a high reflector facet of the semiconductor laser and so as to reduce a lateral divergence beam in a laser beam emitted from the output facet.

The foregoing and other objects, features, and advantages of the disclosed technology will become more apparent from the following detailed description, which proceeds with reference to the accompanying figures.

DETAILED DESCRIPTION

Figure 1A:
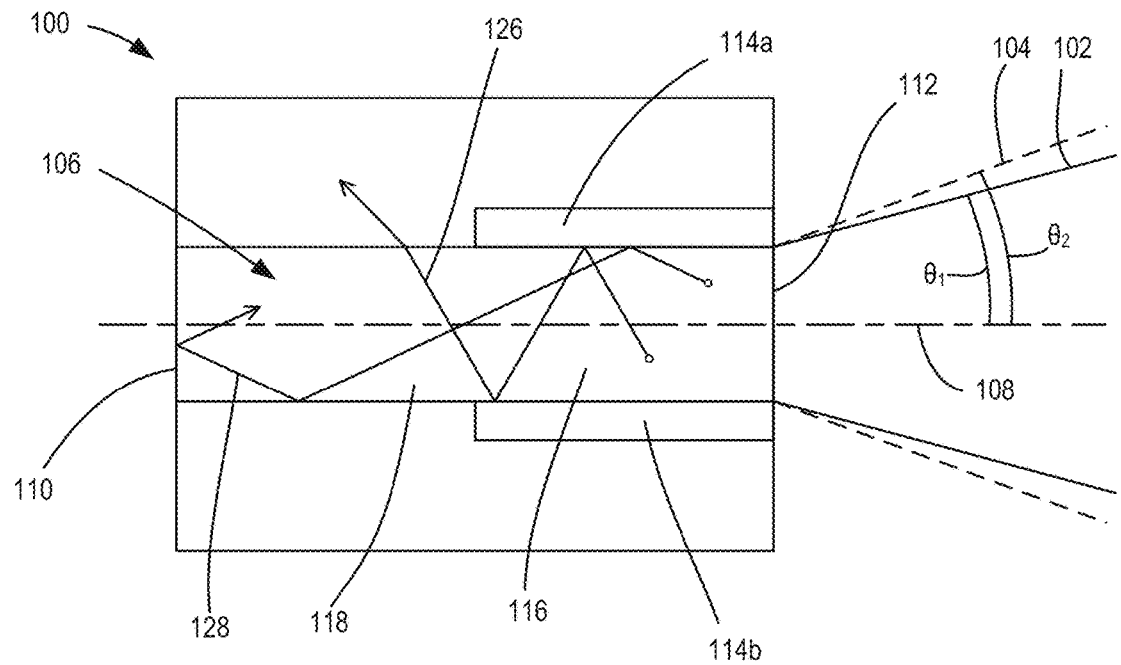
FIG. 1A is a top view of an example broad area laser diode (BAL).

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art. In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

As used herein, laser beam refers to electromagnetic radiation at wavelengths of between about 100 nm and 10 µm, and typically between about 500 nm and 2 µm. Examples based on available laser diode sources generally are associated with wavelengths of between about 600 nm and 2000 nm and can be tailored based on semiconductor composition including indium, gallium, arsenic, etc. In some examples, propagating optical radiation is referred to as one or more beams having diameters, asymmetric fast and slow axes, beam cross-sectional areas, and beam divergences that can depend on beam wavelength and the optical systems used for beam shaping. For convenience, optical radiation is referred to as light or beams in some examples, and need not be at visible wavelengths.

Typical laser diodes have emission regions having non-circular cross-sections. An emission region of a laser diode can be associated with a slow axis that is directed along a longest dimension of the emission region and a fast axis that is directed along a shortest dimension of the emission region. Along the slow axis, an emitted beam tends to have a smaller angular divergence than the angular divergence along the fast axis. In addition, the slow axis tends to be associated with beam propagation in more transverse modes than beam propagation in the fast axis so that a beam parameter product (corresponding to a product of an angular divergence and a beam dimension) measured along the slow axis is larger than that measured along the fast axis. Beam divergences and diameters along the slow axis, the fast axis, or both can be adjusted with one or more lenses, prisms, or mirrors to provide selected beam characteristics after emission from a laser diode.

The term brightness is used herein to refer to optical beam power per unit area per solid angle. In some examples, optical beam power is provided with one or more laser diodes that produce beams whose solid angles are proportional to beam wavelength and inversely proportional to beam area. Selection of beam area and beam solid angle can produce pump beams that couple selected pump beam powers into one or more core or cladding layers of double, triple, or other single or multi-clad optical fibers. Beam cross-sectional areas, diameters, or other beam dimensions can be described using boundaries that generally correspond to a zero intensity value, a 1/e value, a $1/e^2$ value, a full-width half-maximum (FWHM) value, or other suitable metric.

Representative embodiments herein can provide a slow axis brightness improvement for broad area laser diode output beams for a selected emitter width by suppressing higher order modes along the slow axis and conserving lower order modes. In general, reducing a BAL emitter width typically reduces a laser diode output beam power corresponding to slow axis brightness maxima. Thus, in some examples, laser diode beam output powers corresponding to slow axis brightness maxima can be maintained or decrease by a lesser amount as compared to conventional BALs. The laser diode output beams operating at high power and with a high brightness can be combined in laser diode modules and can be fiber- or free-space coupled from the laser diode modules for various applications, such as fiber laser pumping or direct diode laser processing applications. The higher brightness performance allows various applications to scale in power and can lower the cost-per-watt of producing the laser diodes.

Examples herein typically refer to index-guiding and gain-guiding as the predominant confinement mechanisms by which lateral optical modes (i.e., across the slow axis) are confined in broad area laser cavities. Vertical mode confinement (i.e., across the fast axis) is typically well defined through index-guiding with n-type and p-type cladding layers of predetermined refractive indexes. In general, the lateral optical modes supported by a semiconductor laser cavity having a zero lateral refractive index variation ($\delta n=0$) in an unpowered, cold state become gain-guided during a powered state as the injected current induces a lateral index variation ($\delta n<0$) between electrically pumped and unpumped regions. Other non-zero lateral refractive index differences (including negative ones) in unpowered cavities can also allow gain-guided operation with selective current injection. However, a cold cavity having a sufficiently large non-zero lateral refractive index variation ($\delta n > \delta n_{INDEX} > 0$) will compensate the negative index step induced by injected current and generally provide index-guided confinement of the lateral optical modes across a range of injected current and corresponding output beam powers. An optical mode is guided by gain below such a lateral index contrast, and is guided by index above it. Under high power operation (such as with single-emitter broad area laser diodes), a lateral thermal gradient induces an additional positive lateral index difference associated with thermal lensing that is typically larger than such a lateral index contrast $\delta n_{INDEX}$. For example, at high powers, index guiding can be provided even without a ridge structure providing a positive lateral refractive index difference. In some high power laser diode examples, regions or operation can be referred to as gain-guided based on lateral index contrasts that are zero or negative in an unpowered state or during low current operation and that become weakly index guided during high power operation with associated thermal lensing effects. Herein, gain-guided can also refer to gain-guided lateral index contrasts during high power operation with associated thermal lensing. In further examples, weak index guided can refer to weak index guiding at high powers with gain guiding occurring at lower powers or in a cold cavity state and also to index guiding or weak index guiding at high powers and weaker index guiding at low powers or in a cold cavity state. Lateral index guiding and gain guiding is explained in more detail by Govind Agrawal in "Lateral Analysis of Quasi-Index-Guided Injection Lasers: Transition from Gain to Index Guiding," Journal of Lightwave Technology, Vol. LT-2, No. 4, August 1984, which is incorporated herein by reference.

The threshold $\delta n_{INDEX}$ between gain-guiding and index-guiding behavior for a typical semiconductor laser cavity having a uniform lateral refractive index profile along its length can depend on various characteristics and parameters of the cavity, including length, semiconductor layer thicknesses, carrier densities, active layer type and thickness, emitter/reflector widths, gain, operating wavelength, etc., as will be readily appreciated by those with skill in the art. In various semiconductor laser examples herein, a threshold $\delta n_{INDEX}$ between gain-guiding and index-guiding occurs between about $1 \times 10^{-6}$ and $1 \times 10^{-5}$, $1 \times 10^{-5}$ and $1 \times 10^{4}$, $1 \times 10^{4}$ and $1 \times 10^{-3}$, $1 \times 10^{-3}$ and $1 \times 10^{-2}$, $1 \times 10^{-2}$ and $1 \times 10^{-1}$. In various examples herein, waveguide thicknesses are typically constant and can include from about 0.5 μm to about 5 μm. In selected high powered semiconductor laser examples described herein, a threshold $\delta n_{INDEX}$ is typically on the order of $10^{-5}$ and output beams are generated with multiple transverse optical modes along the slow axis. Gain-guided output beams typically exhibit poor output beam characteristics, such as multiple intensity lobes or asymmetric intensity characteristics, at higher powers. The poor output beam characteristics can be associated with beam filamentation, beam focusing and defocusing within the cavity, thermal lensing, spatial hole burning, and other nonlinear effects in the optical cavity. In some gain-guided examples, the laser threshold current increases significantly compared to similar index-guided examples.

In some semiconductor device examples described herein, two-step or variable gain-guided and index-guided hybrid structures are disclosed. Gain stripes extend through an entire or substantial portion of a length of the devices, and typically correspond to a metal stripe of current injection, a stripe in the cap layer, or a stripe that is defined by a ridge structure with shallow etch/weak index guiding. A ridge waveguide structure near a front facet of the device has larger index contrast of the lateral waveguide than that near a back facet. In typical examples, a width of the ridge waveguide structure is equal to or slightly wider than the gain stripe so as to minimize loss to the forward propagating beam when transitioning from the gain-guided waveguide into the index-guided waveguide. In some experimentally tested examples, hybrid structures provide higher brightness and lower beam parameter product by greater than 10% over standard index-guided laser diodes with other features kept the same or similar. It will be appreciated that various examples can include more than two index difference steps along the length of the waveguide.

In examples with variable gain-guided and index-guided hybrid structures, a refractive index difference (typically a step) for the lateral waveguide varies along at least a portion of the cavity length, with a lower Δn towards the back facet and higher Δn towards the front facet. The variation in lateral index of refraction difference can be obtained by varying a depth of etch or depth of the low index cladding material surrounding the ridge waveguide structure, with a deeper etch providing a larger lateral index contrast or by longitudinally varying an ion-implanted region outside the pumped stripe, including by varying ion energy, depth, and/or density. Etch depth variation along the length can be realized with, for example, grayscale photolithography: the grayscale in the photomask is transferred into gradients of the exposure dose to achieve a selected photoresist topography during development, and etch depth profile during semiconductor etch. In one alternative, groove widths, defined by photolithography, can be used to control the etching rate, so that a longitudinally varying groove width leads to longitudinally varying groove etch depth. While linear variation in refractive index difference is described, it will be appreciated that other variations are possible, including combinations of linear and step, curved, exponential, quadratic, and piece-wise sections of different variation types.

In representative examples, the slow axis divergence angle of an output beam emitted by the semiconductor device is determined by the waveguide confinement near the back facet and therefore the ridge waveguide structure near the front facet can be strongly index-guided so as to provide a well-defined slow-axis near field without increasing the slow axis divergence angle. Such performance can be contrasted with the larger divergence angles in broad area lasers that include a strong index-guiding ridge along the full length of the diode laser, where the large lateral index of refraction step can support many higher order modes.

Various examples herein describe ways to induce or vary a lateral index difference, including providing a variation of the difference along a length. It will be appreciated that such examples are not exhaustive, and it is contemplated that other mechanisms can be used to provide variation in lateral index difference, both laterally and in a longitudinal direction. Moreover, simple step-wise lateral index differences are shown to simplify explanation. It will be appreciated that various lateral index shapes can be provided, including shapes that are other than rectangular (sloped, curved, crenulated, etc.) or that vary during active operation of a device.

Figure 1B:
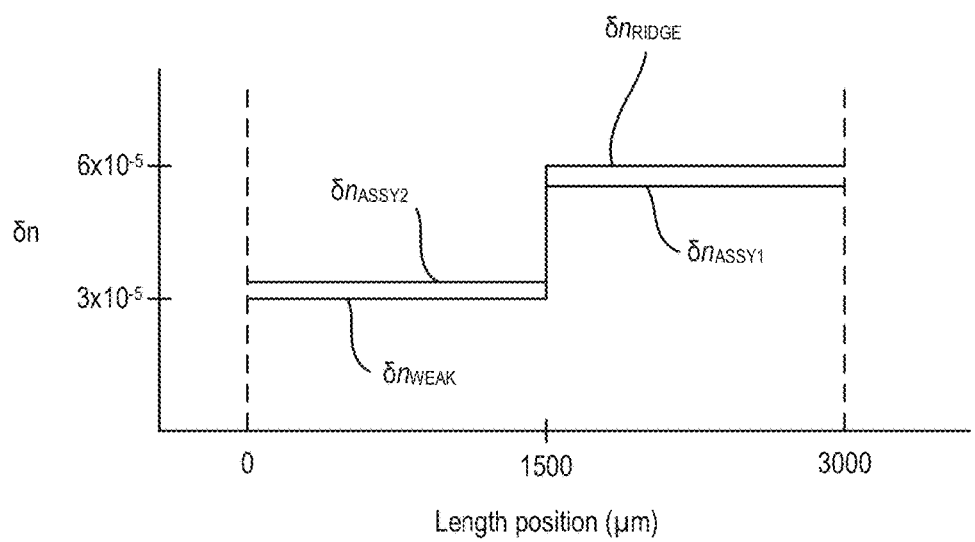
FIG. 1B is a graph of refractive index profile with respect to longitudinal position for the BAL shown in FIG. 1A.
Figure 1C:
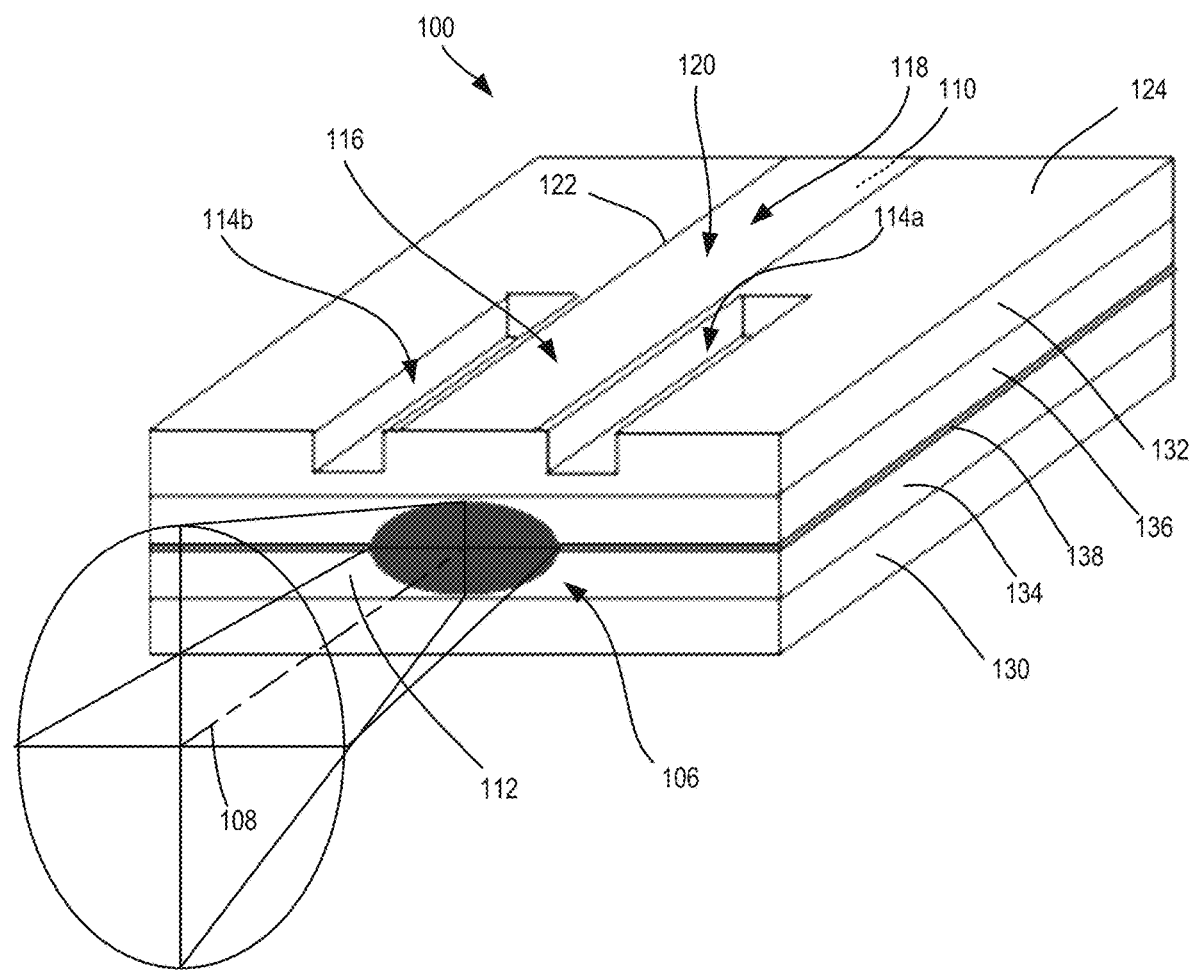
FIG. 1C is a perspective view of the BAL shown in FIG. 1A.

FIGS. 1A-1C shows a representative example of a semiconductor laser 100 that emits an output beam 102 with a reduced slow axis divergence angle $\theta_1$ based on a variable lateral refractive index profile along a laser diode length that suppresses or assists with the suppression of higher order modes. For comparison, an optimized conventional BAL with similar geometrical (e.g., emitter/reflector widths, cavity length, etc.), epitaxial (e.g., doping levels, carrier concentrations, layer thicknesses, etc.), and operational characteristics (e.g., pumping levels), produces an output beam 104 with a slow axis divergence angle $\theta_2$ that is larger than $\theta_1$. The semiconductor laser 100 includes a Fabry-Perot cavity 106 that is formed along a longitudinal axis 108 between a high reflector (HR) facet 110 and a partial reflector (PR) facet 112. The semiconductor laser 100 can be formed in various geometries and configurations, and include various arrangements of p-type, n-type, active, cap, and dielectric layers. On a more general level, the semiconductor laser 100 typically includes an n-type clad layer 130 and a top p-type clad layer 132 between which the cavity 106 is formed with an n-type waveguide layer 134, a p-type waveguide layer 136, and an active layer 138 between the n-type and p-type waveguide layers 134, 136. The active layer 138 typically includes multiple quantum wells, but other configurations are possible, including p-n junction homostructures, heterostructures, double-heterostructures, single quantum wells, quantum wires, quantum dots, etc. The p-type clad layer 132 can be etched into various shapes to form ridge structures or mesas, and one or more dielectric and/or cap layers can be formed to guide current through the active layer 138.

The high reflector facet 110 is typically a cleaved semiconductor facet that is coated with a highly reflective coating, so as to provide optical reflectivity in a wavelength range of interest, corresponding to a lasing wavelength of the semiconductor laser 100, typically in the range of 50%, 80%, 90%, 95%, 99%, 99.9%, 99.99%, or greater, and more typically at least 90% so as to increase a power efficiency in the generation of the output beam 102. The partial reflector facet 112 is also typically a cleaved semiconductor facet, and is coated with an anti-reflectivity coating that provides a selected partial reflectivity that is selected in relation to the desired gain characteristics of the semiconductor laser 100. The partial reflector facet 112 can provide a reflectivity in the range of less than or equal to 40%, 20%, 10%, 5%, 2%, 0.5%, etc. It will be appreciated that various facets of other embodiments described herein can have similar reflectivities.

The semiconductor laser 100 also includes a pair of opposite lateral index-guiding elements 114a, 114b adjacent to the cavity 106, forming a lateral ridge waveguide portion 116 at or near the PR facet 112 that extends a predetermined distance into the cavity 106. The length of the ridge waveguide portion 116 can correspond to the length of the index-guiding elements 114a, 114b, which extend less than the full length of the cavity 106 along the longitudinal axis 108. By way of comparison, a BAL structure producing the slow axis divergence angle $\theta_2$ typically includes a ridge waveguide structure that extends the full length of a corresponding cavity so that the full length of the cavity is index-guided with a constant lateral refractive index profile along the length. The ridge waveguide portion 116 is index-guided by the adjacent index-guiding elements 114a, 114b with a low-index material, such as air, dielectric, or semiconductor material.

A lateral waveguide portion 118 proximate the HR facet 110 is defined by a current aperture 120 of a metal contact stripe or cap layer stripe 122 extending along a top surface 124 of the semiconductor laser 100. The stripe 122 typically extends the full length of the semiconductor laser 100 though less than the full length or separated stripe portions can be defined, for example, so as to provide separate electrically pumped contact areas. In some configurations, the stripe 122 can be defined in relation to adjacent shallow depressions (e.g., by etching) extending the length of the semiconductor laser 100 or the stripe 122 is situated in a raised ridge configuration extending the length of the semiconductor laser 100 relative to adjacent portions of the top p-type clad layer 132, so as to introduce a weak refractive index difference guide along the length of the semiconductor laser 100.

The stripe 122 is electrically coupled to an electrical source (e.g., with electrical leads or additional metal layers or contacts) so that the lateral waveguide portion 118 is gain-guided at low current and becomes weakly index-guided at high current where higher optical field strengths and local temperature gradients produce thermal lensing and local increases in refractive index. As shown in the graph in FIG. 1B, a lateral refractive index profile difference $\delta n_{RIDGE}$ along the length of the ridge waveguide portion 116 is larger than a lateral refractive index profile difference $\delta n_{WEAK}$ along the length of the lateral waveguide portion 118, providing a different, higher, refractive index difference δn for lateral optical confinement near the PR facet 112 than near the HR facet 110.

In typical examples, the amount of decrease of the lateral refractive index profile difference δn is sufficient to reduce the number of supported lateral optical modes. Because of weak index guiding in the lateral waveguide portion 118, higher order modes that are supported by the ridge waveguide portion 116, such as the mode depicted by internally reflecting ray 126, have divergence angles larger than the critical angle (defined relative to the waveguide edge) of the weakly guided lateral waveguide portion 118. The mode associated with ray 126 therefore leaks out of the cavity 106 so that it does not reflect back into the semiconductor laser 100 at the high reflector 110 or couple back into the ridge waveguide portion 116. A lower order lateral mode that reflects at a divergence angle that is smaller than the critical angle, such as depicted by reflecting ray 128, remains guided within the cavity 106. As a result, the slow-axis divergence angle $\theta_1$ of the output beam 102 of the semiconductor laser 100 is smaller than an output beam 104 emitted from a BAL of the same emitter width and with a ridge structure extending the full length. In representative embodiments, the output power and beam dimension of the output beam 102 of the semiconductor laser 100 can be the same as a similar BAL structure emitting the output beam 104, so that the output beam 102 has a comparatively higher slow axis brightness.

In some examples, at one or more selected positions (or lengths) along the longitudinal axis 108, the lateral refractive index profile difference δn can be different at opposite lateral sides of the lateral waveguide portions 116, 118. For example, the refractive index elements 114a, 114b or the different lateral sides of the waveguide portion 118 can contribute different index steps or variations. In one example, the refractive index element 114a and the corresponding (or opposite) side of the lateral waveguide portion 118 are provided with refractive index profile differences $\delta n_{ASSY1}$, $\delta n_{ASSY2}$, respectively. Other asymmetric profiles are possible and can be applied to selected portions of waveguides or waveguide portions.

Figure 2A:
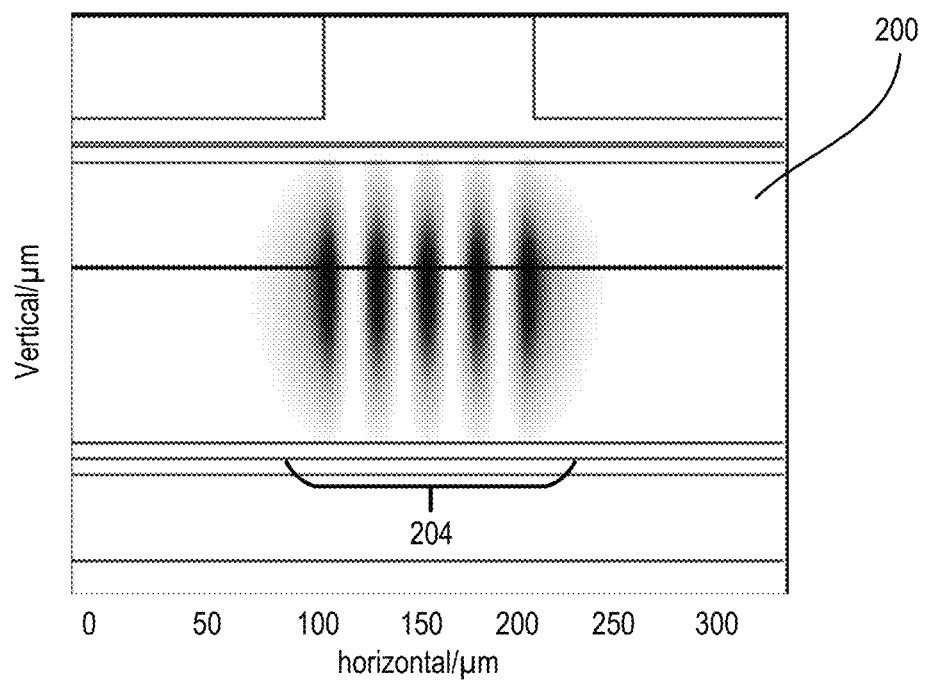
FIGS. 2A-2B are end views of BAL during simulated active operation.
Figure 2B:
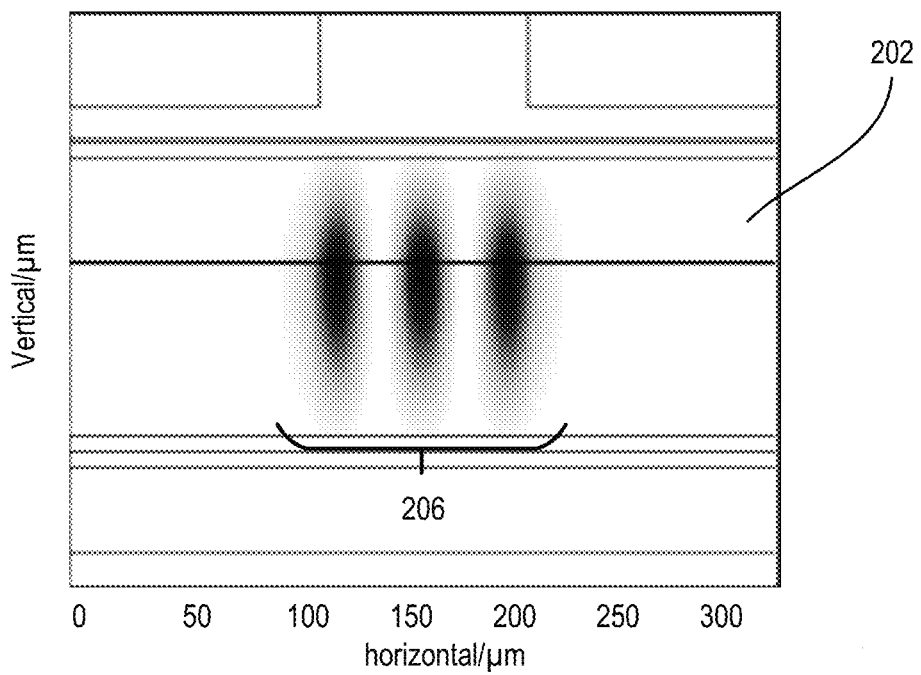

FIGS. 2A-2B shows a simulated output of an optical mode propagation model for a broad area semiconductor laser with a 100 μm emitter aperture. In FIG. 2A, a ridge waveguide 200 is provided with a lateral refractive index profile difference of $6 \times 10^{-5}$ along a length of the broad area semiconductor laser, and in FIG. 2B a similar ridge waveguide 202 is provided with a lateral refractive index profile difference of $3 \times 10^{-5}$. The highest confined lateral mode for the ridge waveguide 200 is a fourth order mode 204, while the highest confined mode for the ridge waveguide 202 is second order mode 206. Based on the decreased support for higher modes shown by the model, a waveguide with a lateral refractive index profile that varies along the length of the waveguide can be theorized, with the waveguide having a δn of about $3 \times 10^{-5}$ near a rear facet and a δn of about $6 \times 10^{-5}$ near an opposite output facet and with the waveguide supporting the second order mode 206 as the highest lasing mode. An output beam would have a lower slow axis divergence angle due to the reduction in higher order mode content while maintaining the beam dimension, and a corresponding slow-axis brightness is improved based on the reduced divergence angle and higher order lateral mode suppression. Additionally, the decrease in refractive index profile difference can reduce the slow axis divergence of the output beam without introducing a power and efficiency penalty during operation, as the higher order lateral modes are not confined by the weakly guided portion of the waveguide and are therefore suppressed, while the fundamental and lower order lateral modes are guided by the weakly guided portion of the waveguide without introducing additional loss. However, waveguides that are gain-guided or weakly index-guided throughout the longitudinal direction, even though the lateral index contrast is small and fewer lateral modes are supported, the formation of filaments typically increases the lateral divergence angle of the output beam and such devices can suffer from high threshold current, low differential quantum efficiency, and output beams with a poorly defined slow-axis near field. Conversely, a higher index contrast near the output facet (e.g., the PR facet 112 in semiconductor laser 100) can result in a stable and well-defined slow-axis near-field and allow a reduction in the divergence angle in the far field of the output beam.

Figure 3:
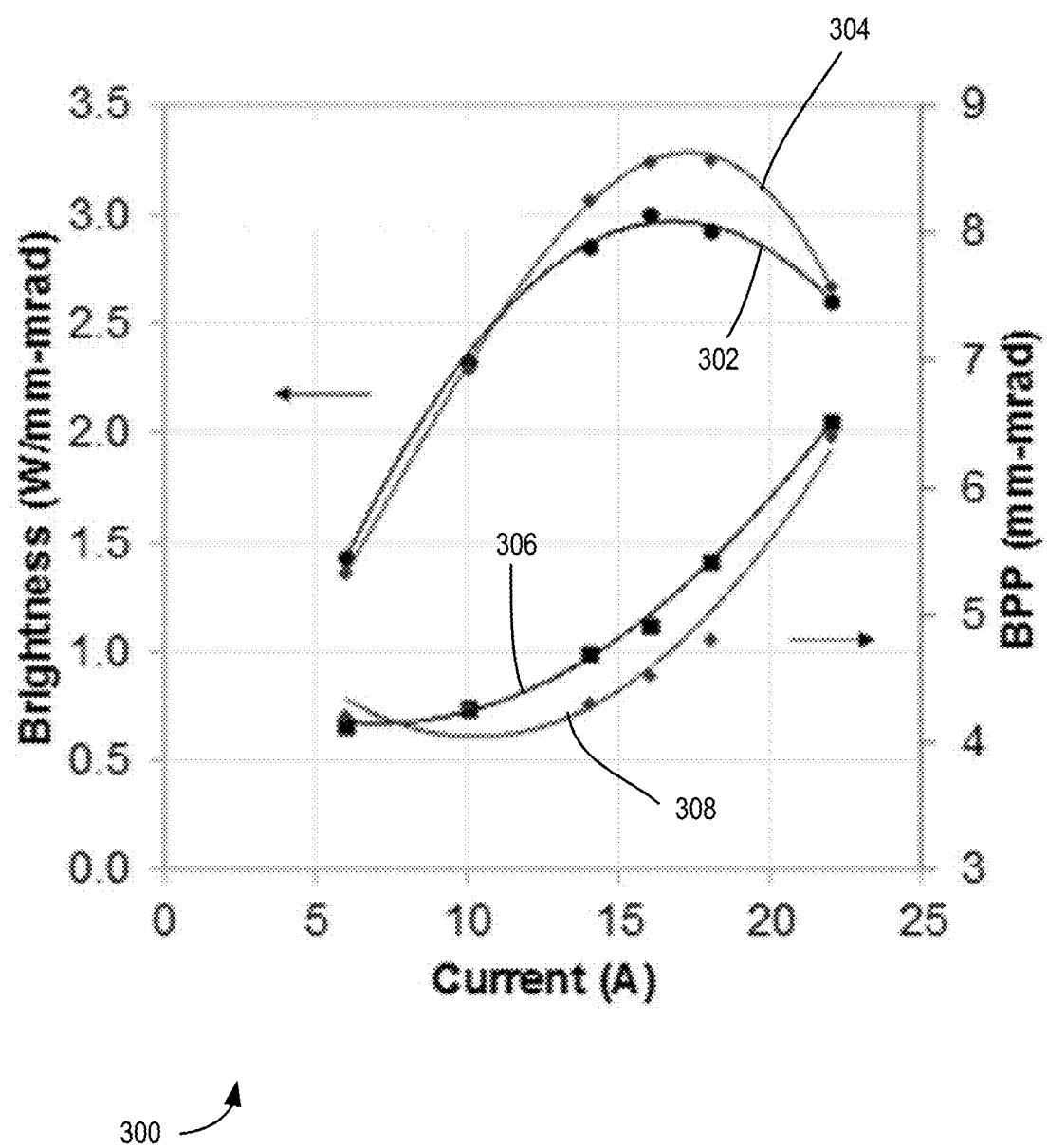
FIG. 3 is a graph of output beam brightness and beam parameter product versus current for an example BAL.

A graph 300 in FIG. 3 illustrates the performance improvement that has been experimentally obtained with semiconductor laser examples herein that produce a reduced slow axis divergence. With a curve-fit line 302, the brightness of a semiconductor laser having an index-guided ridge waveguide extending the length of the laser and configured to emit at 976 nm is shown in the current range from about 6 A to about 22 A. The brightness of the output beam of a similar device (e.g., identical emitter apertures, contact areas, etc.) that includes a decrease in refractive index profile difference between an output facet and a high reflector facet so as to define index guided and gain guided regions (e.g., such as the profile shown in FIG. 1B), is plotted over the same current range with a curve-fit line 304. As shown in the operational range of 11 A to 22 A, which can correspond to suitable high power operation in some example devices, modules, and systems, the line 304 demonstrates the higher brightness performance of the representative slow axis divergence decreasing devices herein, including approximately a 10% improvement (an increase from about 3.0 to about 3.3 W/mm-mrad) at a peak brightness around 16-18 A. A similar improvement in slow axis BPP is demonstrated between curve fit line 306, which shows the slow axis BPP of the waveguide structure associated with line 302 over the same current range, and curve fit line 308, which shows the BPP of the waveguide structure associated with line 304. Across the current range between about 7.5 A and 22 A, the BPP is lower (and therefore improved) for the slow axis divergence decreasing devices having a decrease in a refractive index profile difference between an output facet and high reflector facet than the index-guided ridge waveguide devices.

Figure 4A:
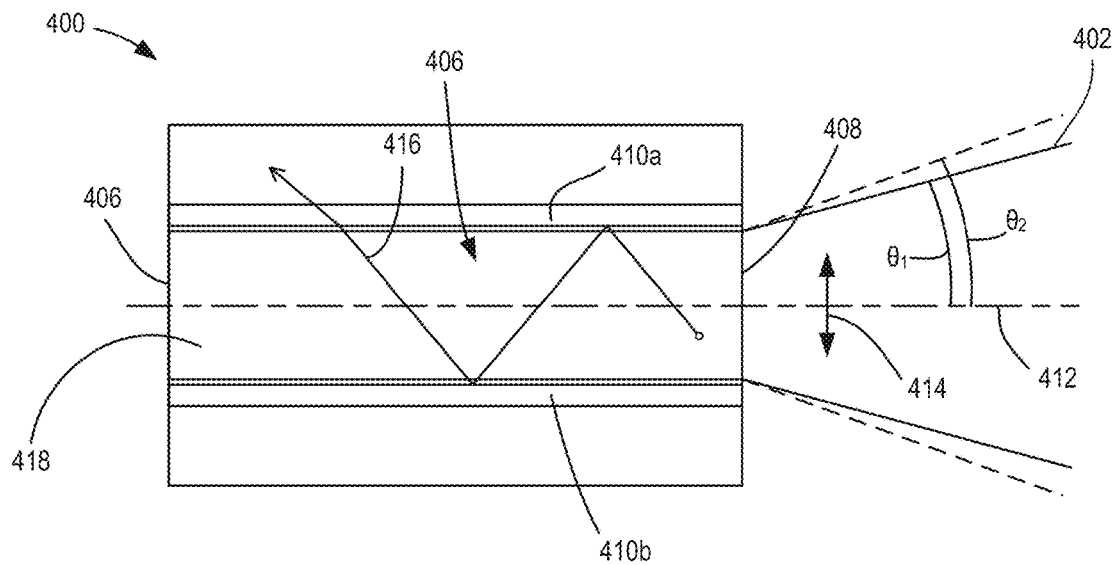
FIG. 4A is a top view of another example BAL.
Figure 4B:
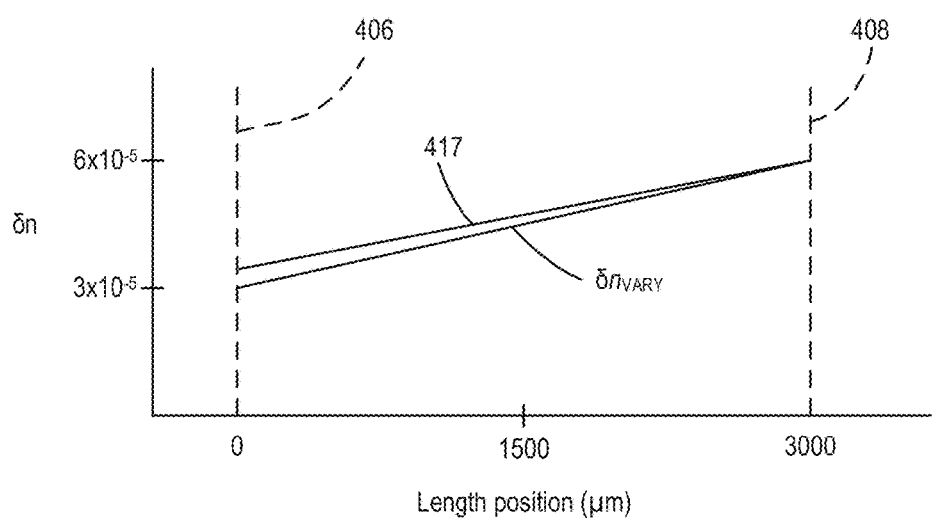
FIG. 4B is a graph of refractive index profile with respect to longitudinal position for the BAL shown in in FIG. 4A.
Figure 4C:
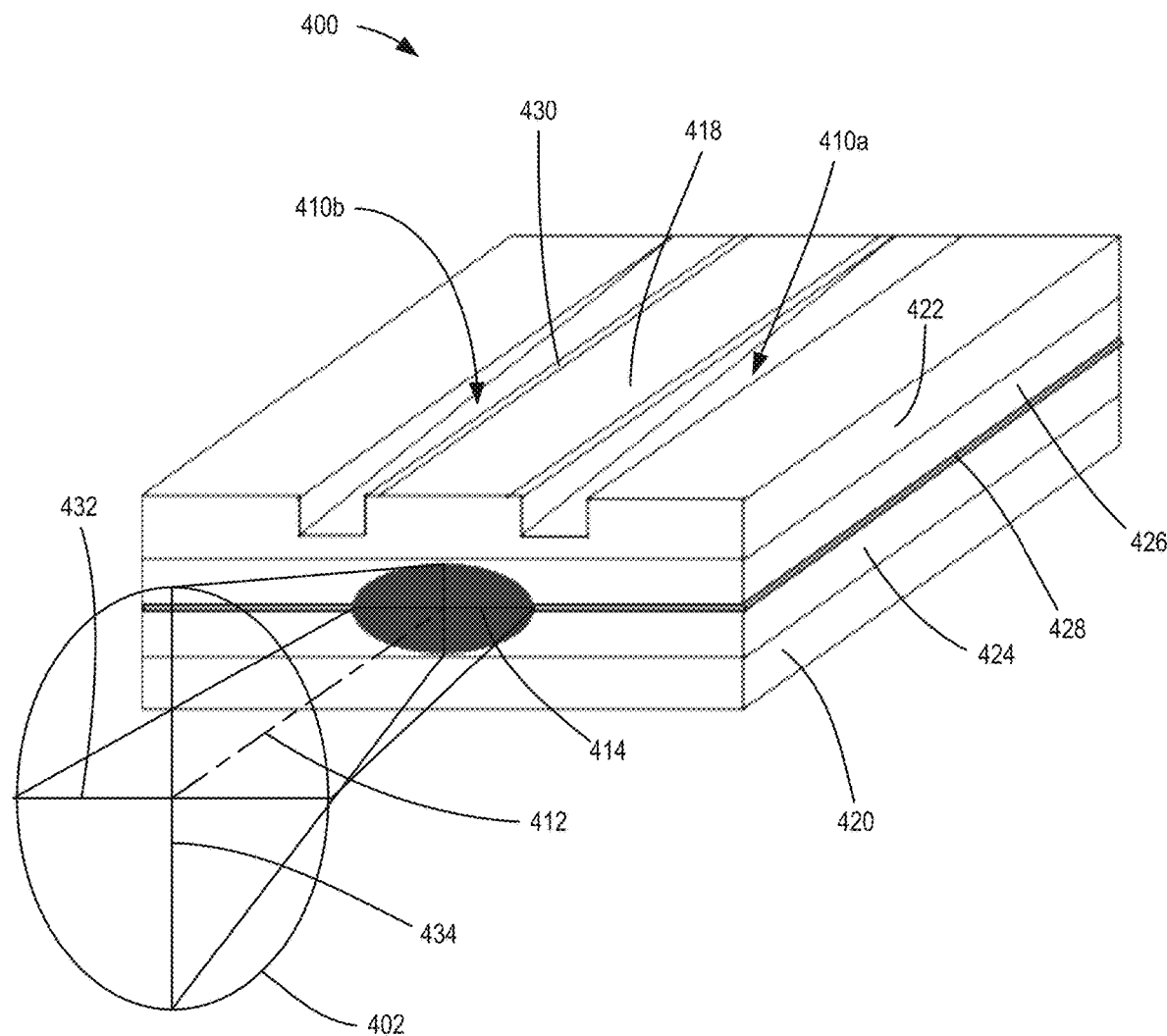
FIG. 4C is a perspective view of the BAL shown in FIG. 4A.

FIGS. 4A-4C illustrate another example of a semiconductor laser 400 that produces an output beam 402 having a reduced slow axis divergence $\theta_1$ as compared to other devices with similar structures that produce a slow axis divergence $\theta_2$. The semiconductor laser 400 includes a semiconductor waveguide 404 extending between a high reflector (HR) facet 406 and a partial reflector (PR) facet 408 of suitable selected reflectivities selected in relation to various internal or external device characteristics, such as carrier density, emission wavelength, gain bandwidth, waveguide cavity dimensions, semiconductor composition, quantum well structure, external cavity structure, etc., and typically corresponding to high power laser operation.

The semiconductor laser 400 also includes a pair of refractive index elements 410a, 410b adjacent to the semiconductor waveguide 404 that have a variable depth, shown in FIG. 4C, along the length of a longitudinal axis 412 of the semiconductor waveguide 404, with the depth decreasing from the position parallel to the partial reflector facet 408 to the position parallel to the high reflector 406. The longitudinal depth varying continuously in the longitudinal direction also varies the optical confinement in a lateral direction 414 of the semiconductor waveguide 404, as seen in FIG. 4B, so that the lateral index difference $\delta n_{VARY}$ of the semiconductor waveguide 404 increases continuously from a gain-guided or weakly index-guided index difference near the high reflector facet 406 to an index-guided difference near the partial reflector facet 408.

The depth of the refractive index elements 410a, 410b or the corresponding index difference variation can be provided in various ways, including by varying an etch depth of or associated with the refractive index elements 410a, 410b. By increasing the etch depth, the lateral refractive index difference of the lateral ridge waveguide also increases. A high order transverse optical mode 416 of an internal beam propagating in the semiconductor waveguide 404 towards the high reflector 406 is internally reflected until the index difference δn decreases below a critical value associated with the high order transverse optical mode 416, such as an associated critical angle, allowing the high order transverse optical mode 416 to gradually leak out of the semiconductor waveguide 404. The filtering of higher order transverse modes out of the semiconductor waveguide 404 allows preferential lasing within the semiconductor waveguide 404 by lower order transverse optical modes and reduces the slow axis divergence of the output beam 402. In some examples, the depth or depth variation of the refractive index elements 410a, 410b is asymmetric such that for a selected longitudinal position the δn is different between refractive index elements 410a and 410b. For example, a δn can be provided according to $\delta n_{VARY}$ for refractive index element 410a and according to line 417 for refractive index element 410b.

A current aperture 418 extends across a top portion of the semiconductor laser 400 adjacent to the semiconductor waveguide 404 so as to allow current to be injected through the semiconductor waveguide generally perpendicular to the longitudinal axis 412 and the lateral direction 414. In typical examples, the semiconductor laser 400 can include various arrangements of p-type, n-type, active, cap, and dielectric layers. For example, the semiconductor laser 400 can include an n-type clad layer 420 and a top p-type clad layer 422 between which the semiconductor waveguide 404 is formed with an n-type waveguide layer 424, a p-type waveguide layer 426, and an active layer 428 between the n-type and p-type waveguide layers 424, 426. The active layer 428 typically includes multiple quantum wells, but other configurations are possible, including p-n junction homostructures, heterostructures, double-heterostructures, single quantum wells, quantum wires, quantum dots, etc. The p-type clad layer 422 can be etched into various shapes to form ridge structures or mesas, and one or more dielectric and/or cap layers can be formed and a metal contact 430 provided to guide current through the current aperture 418 and active layer 428. In some examples, the metal contact 430 extends laterally so as to form a gap between the refractive index elements 410a, 410b and the metal contact 430, and in other examples the contact 430 terminates at the refractive index elements 410a, 410b. In typical embodiments, the full length of the semiconductor laser 400 is electrically pumped through the current aperture 418, though in some examples, portions of the current aperture 418 are selectively pumped. The output beam 402 emitted from the PR facet 408 typically has an asymmetric spot shape and corresponding different fast and slow axis divergences (discussed hereinabove) along a slow axis 432 and a fast axis 434, respectively. The slow axis 432 generally extends parallel to the various planes of grown semiconductor layers of the semiconductor laser 400 and perpendicular to the longitudinal axis 412. The fast axis 434 has a larger divergence angle than the slow axis and extends perpendicular to the slow axis 432 and the longitudinal axis 412. In typical examples, the fast axis characteristics of the output beam 402 are superior and are at or near the diffraction limit.

Figure 5:
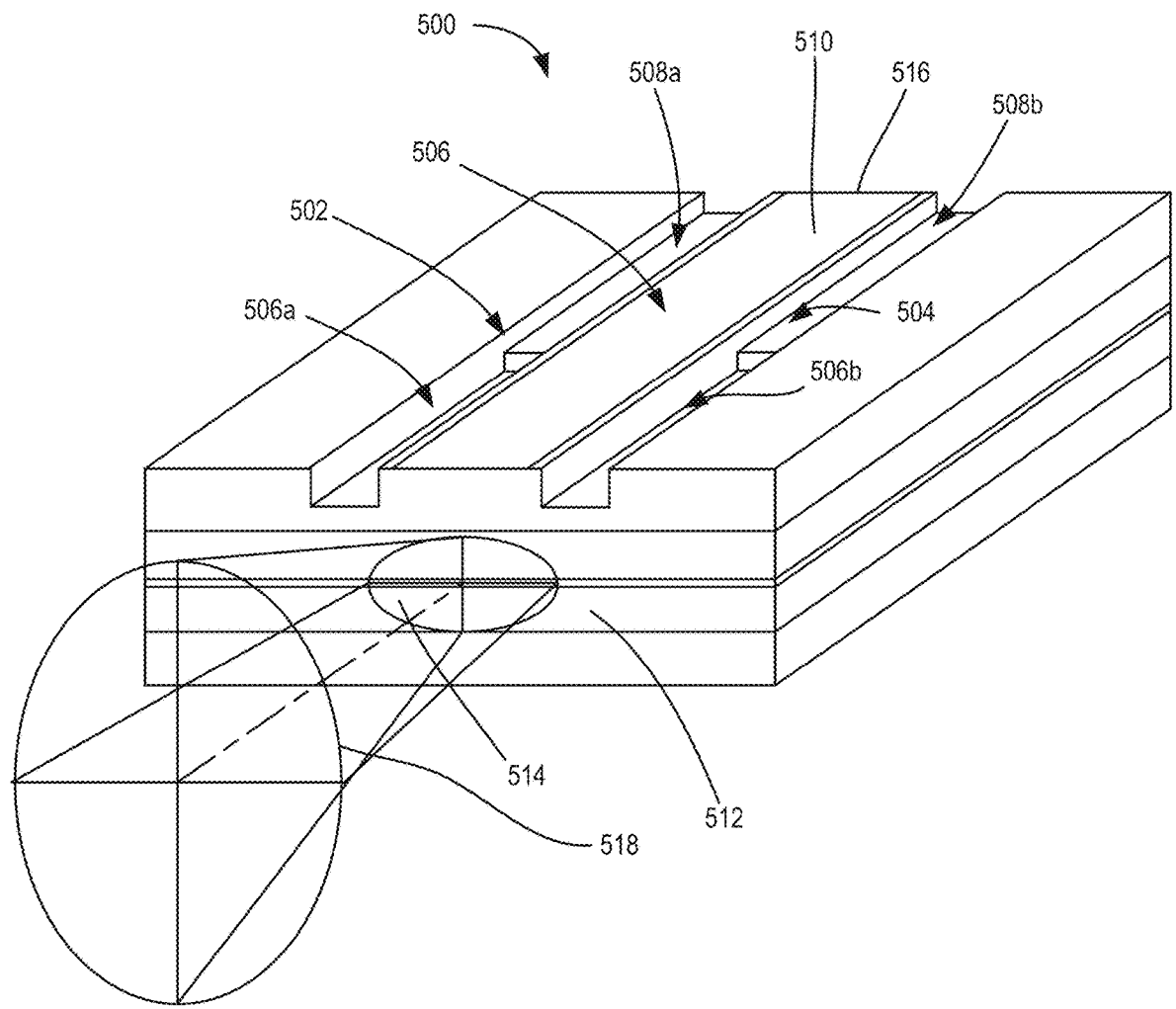
FIG. 5-7 are a perspective views of additional BAL examples.

FIG. 5 depicts a semiconductor laser 500 that includes a pair of refractive index elements 502, 504 on opposite lateral sides of a waveguide ridge 506. A semiconductor laser waveguide 512 is defined below a metal contact 510 of the ridge waveguide 506. The refractive index elements 502, 504 include deep portions 506a, 506b, defining a first lateral refractive index difference for the semiconductor laser waveguide 512 proximate an output facet 514. Shallow portions 508a, 508b define a second lateral refractive index difference, smaller than the first lateral refractive index difference, proximate a high reflector facet 516. In representative examples, the lateral refractive index difference for the deep portions 506a, 506b provides index-guided beam propagation for light within the semiconductor laser waveguide 512, and the lateral refractive index difference for the shallow portions 508a, 508b allows weakly index-guided beam propagation within the semiconductor laser waveguide 512. By providing such a variation along the length of the semiconductor laser waveguide 512, an output beam 518 emitted from the output facet 514 can have substantial output powers and with a lower slow axis far-field divergence angle than similar waveguides having lateral refractive index profiles that do not vary with respect to length.

Figure 6:
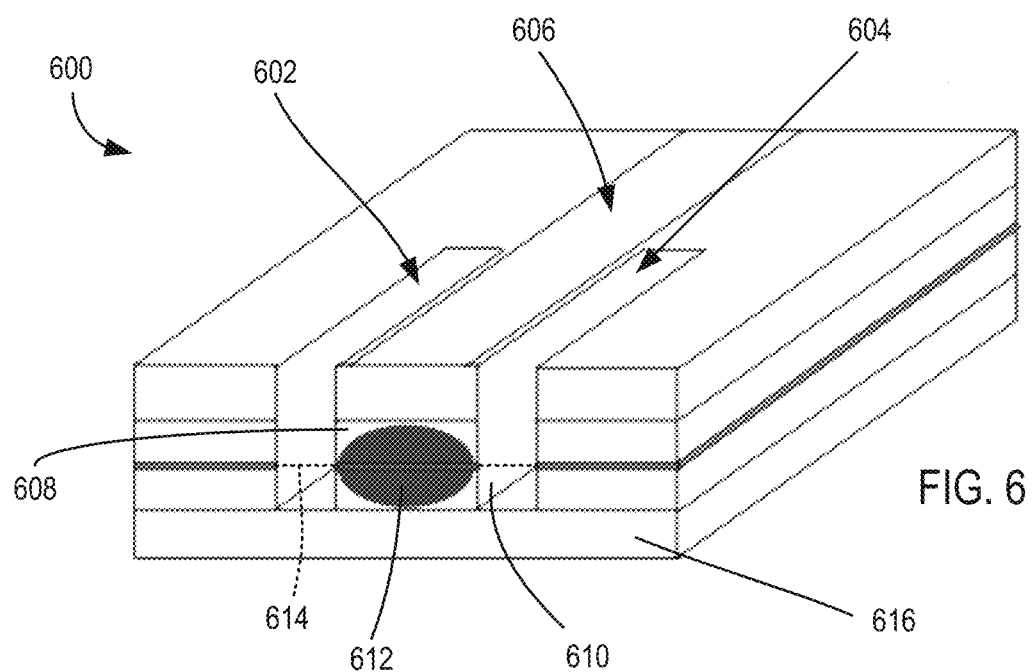

FIG. 6 shows an example of a semiconductor laser 600 that includes refractive index elements 602, 604 opposite a ridge waveguide 606 and that extend from an output facet 608 a predetermined distance along the ridge waveguide 606. The refractive index elements 602, 604 can be defined by an air gap or dielectric/semiconductor in a region that has been etched or provided with to a predetermined depth so as to provide a lateral refractive index difference for a semiconductor waveguide 610 situated to propagate a laser beam 612 that is emitted from the output facet 608. As shown, the depths of the refractive index elements 602, 604 extend below a center emission axis 614 of the laser beam 612 and down to an n-type layer 616 defining a bottom surface of the semiconductor waveguide 610. In further examples, the depth can extend to the center emission axis 614, between the center emission axis 614 and the n-type layer 616, above the center emission axis 614, or into the n-type layer 616. The depths can be selected to improve heat dissipation and provide a stable near-field in the emitted laser beam 612, and in representative examples such deeper refractive index elements 602, 604 do not sacrifice the slow axis far field divergence angle of the emitted laser beam 612, in contrast to a strong index-guiding ridge with deep refractive index elements extending the full length of the waveguide producing a larger divergence angle. The deep etch near the output facet 608 also improves heat dissipation and reduces the lateral thermal gradient, therefore reducing thermal lensing and further reducing the divergence angle of the laser beam 612.

Figure 7:
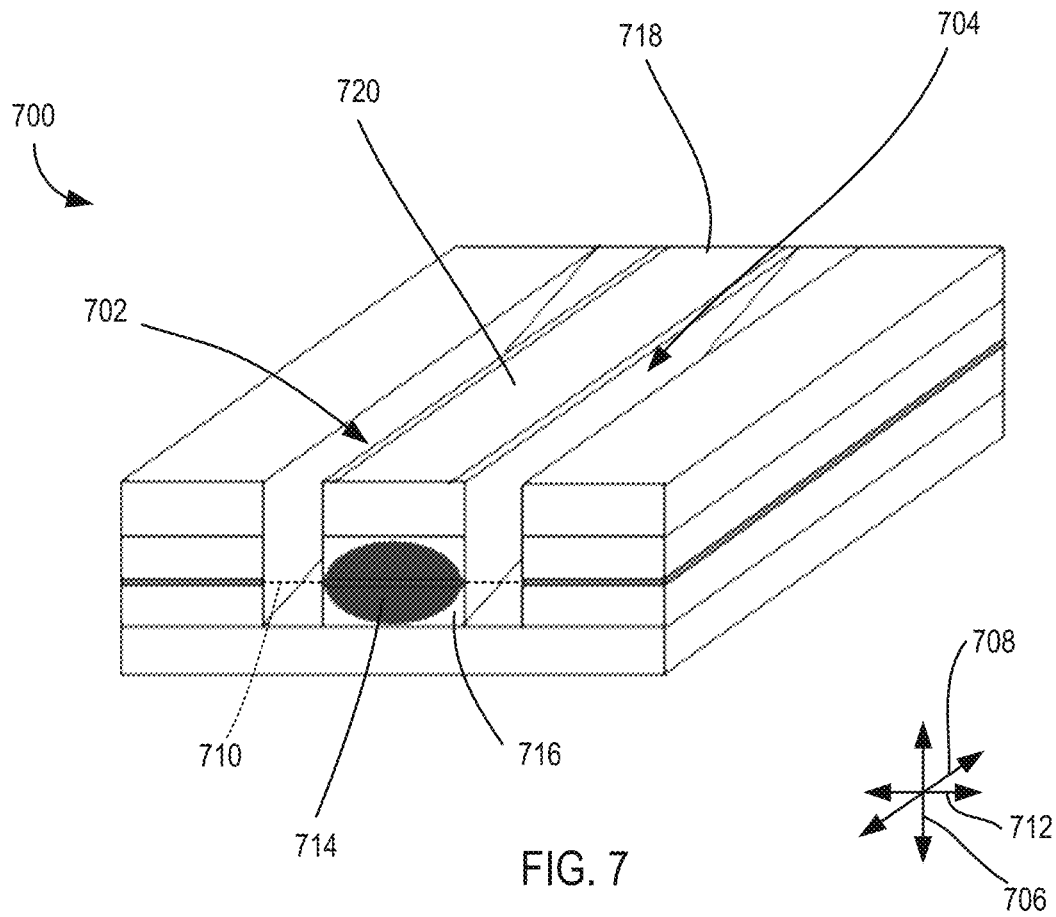

In FIG. 7, a semiconductor laser 700 includes a pair of refractive index elements 702, 704 that extend adjacent to a ridge waveguide and have a depth in a growth axis 706 of the semiconductor laser that varies linearly along a longitudinal axis 708 of the semiconductor laser 700. In representative embodiments, the depth extends below a slow emission axis 710 (parallel to lateral axis 712) of an output beam 714 emitted from an output facet 716 of the semiconductor laser 700. An HR coated back facet 718 defines an opposite cavity mirror for the semiconductor laser 700, and the depth of the refractive index elements 702, 704 can become a zero depth at the back facet 718. In other examples, the depth at the back facet 718 is non-zero or becomes a height such that the refractive index elements 702, 704 are situated above a metal current contact 720.

Figure 8:
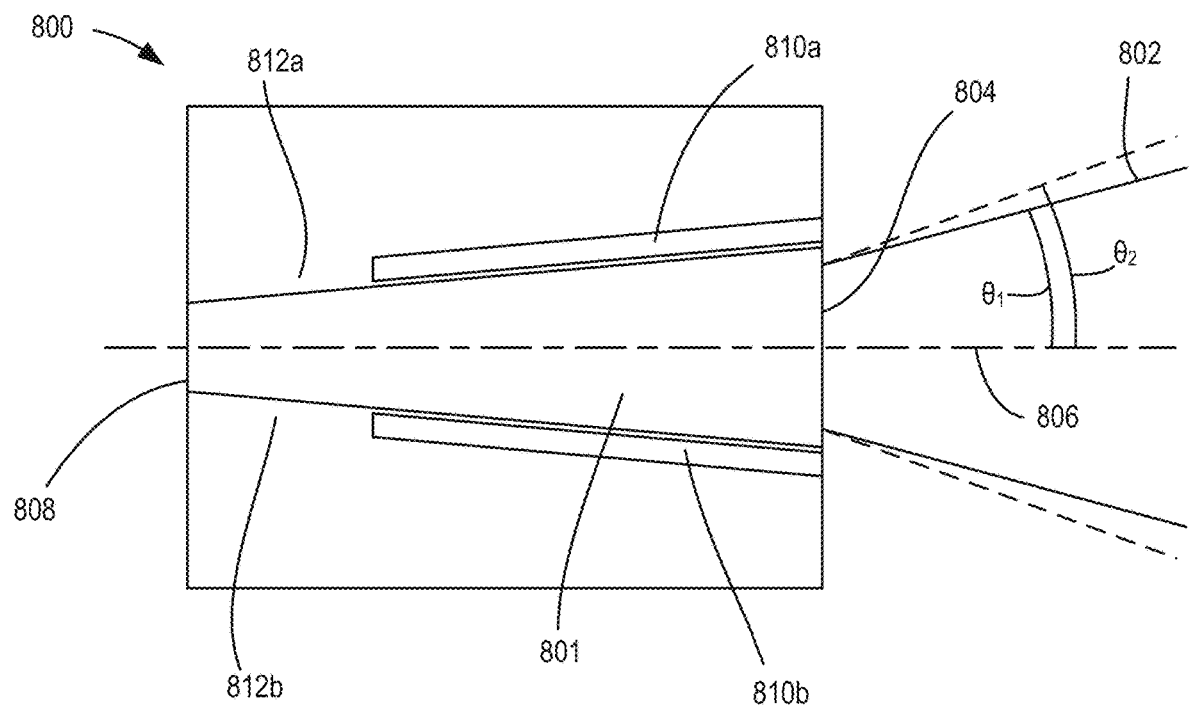
FIG. 8 is a top view of a flared BAL example.

FIG. 8 shows a semiconductor laser 800 flared laser oscillator waveguide 801 that emits an output beam 802 from a partial reflector (PR) semiconductor facet 804. The flaring of the gain region of the waveguide 800 is described in, e.g., U.S. Pat. No. 9,166,369, which is incorporated herein by reference. The waveguide 801 extends along a longitudinal axis 806 to a high reflector (HR) semiconductor facet 808, and as the waveguide 801 a lateral width tapers so that the number of transverse optical modes supported by the waveguide 801 decreases towards the HR semiconductor facet 808. This reduction in lateral mode support contributes to a decrease of the lateral slow axis divergence angle $\theta_1$, improving the beam parameter product of the output beam 802 along its slow axis compared to an angle $\theta_2$ associated with an untapered cavity.

The semiconductor laser 800 also includes refractive index elements 810a, 810b, typically in the form of an air volume provided by, e.g., an etched depth into the semiconductor laser 800 (i.e., into the plane of FIG. 8), that define side index step (or other shaped) differences for a lateral refractive index profile across the lateral direction of the waveguide 801. The refractive index elements 810a, 810b can extend a predetermined distance towards the HR semiconductor facet 808 so that side regions 812a, 812b adjacent to the refractive index elements 810a, 810b provide the waveguide 801 with a refractive index profile with a lower, zero, or negative lateral refractive index difference associated with lateral gain-guided laser operation. In typical examples, the refractive index elements 810a, 810b have a symmetric shape with respect to the longitudinal axis 806, including one or more of a depth, width, etc., and corresponding refractive index difference. However, asymmetric shapes and provided refractive index differences are also possible.

The refractive index profile difference provided by the refractive index elements 810a, 810b is typically associated with lateral index-guided operation in the waveguide 801, or at least index-guided operation nearer to the PR semiconductor facet 804. The variation in the lateral refractive index profile along the longitudinal axis 806 or provision for index-guided operation closer to the PR semiconductor facet 804 and for gain-guided operation nearer to the HR semiconductor facet 808 also contributes to a reduction in the lateral slow axis divergence angle $\theta_1$ as fewer transverse optical modes are supported in the waveguide 801 near the HR semiconductor facet 808 due to the lower lateral refractive index difference.

Figure 9:
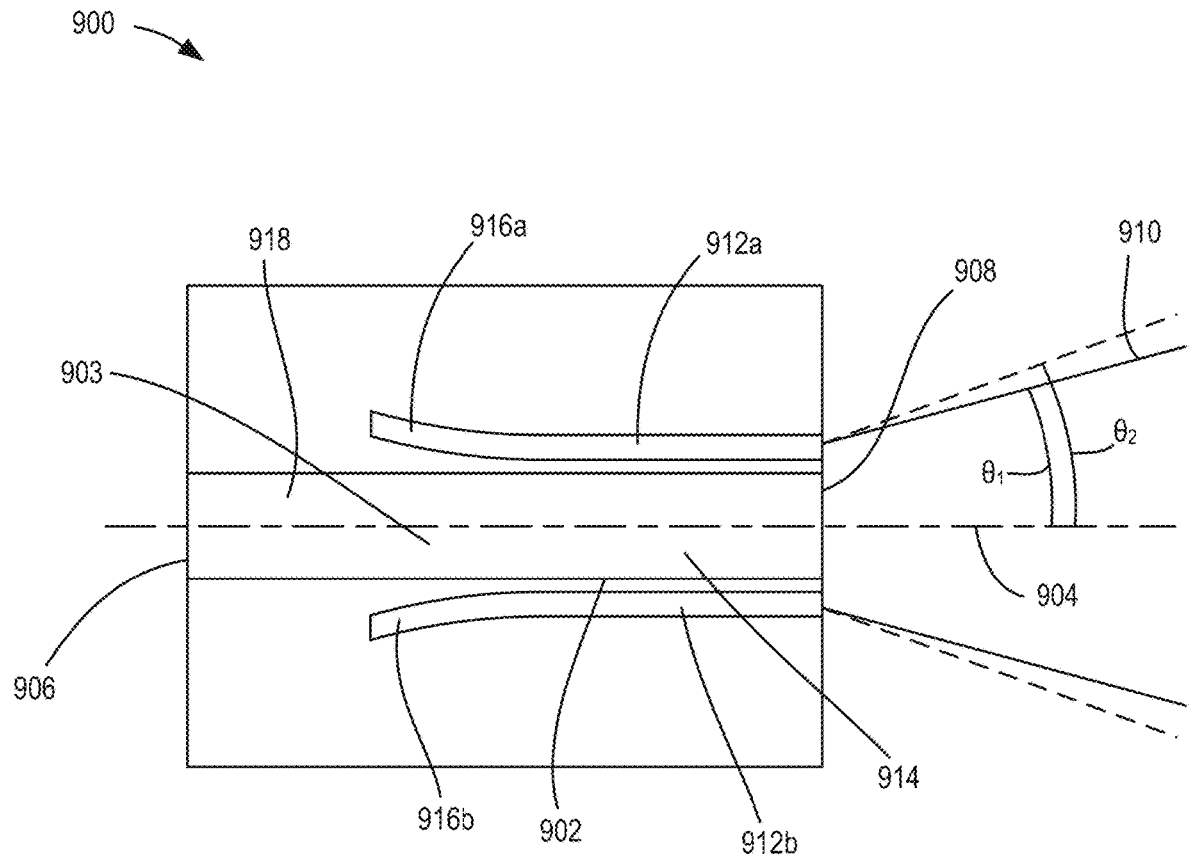
FIG. 9 is a top view of another BAL example.

FIG. 9 shows an example of a semiconductor laser 900 that includes a waveguide 902 situated below a current injection contact 903 extending along a longitudinal axis 904 between a reflective rear facet 906 and a partially reflecting (PR) output facet 908 situated to emit an output beam 910. A pair of refractive index elements 912a, 912b are oppositely situated adjacent to the waveguide 902 extending from the PR output facet 908 a predetermined distance along the waveguide 902. The refractive index elements 912a, 912b assist with defining a lateral refractive index profile for the waveguide 902 so as to provide a lateral index-guided region 914, at least in proximity to the output facet 908. End portions 916a, 916b curve laterally outward away from the waveguide 902 so as to provide a smooth modal transition between a lateral gain-guided region 918 of the waveguide 902 adjacent to the lateral index-guided region 914. While the end portions 916a, 916b are shown to be curved, other shapes are possible including straight, segmented, etc. In representative examples, the curve or other geometry is selected so as to reduce or minimize coupling loss and also to suppress coupling of a cladding beam propagating in the gain-guided region 918 into the index-guided region 914.

Figure 10:
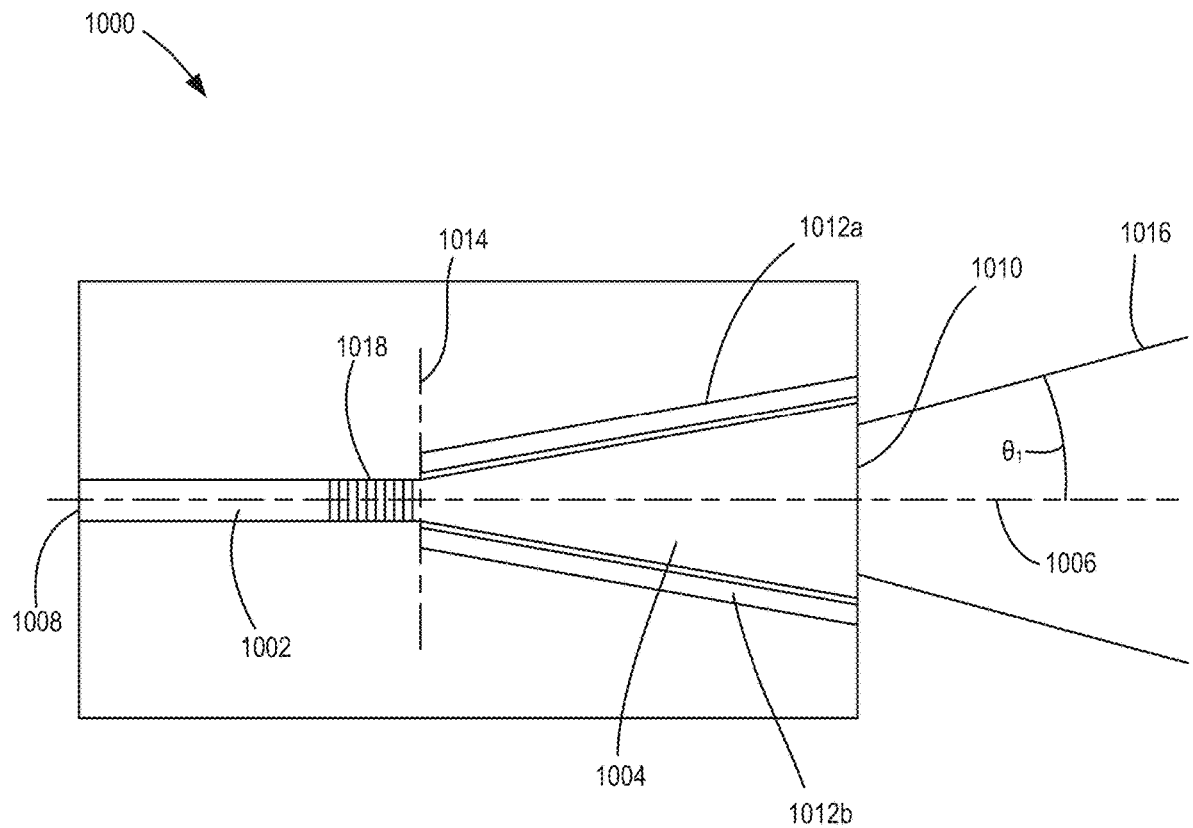
FIG. 10 is a top view of an example semiconductor device.

FIG. 10 shows an example of a semiconductor device 1000 that includes adjacent waveguide sections 1002, 1004 with a constant lateral width and a varying lateral width, respectively, extending along a longitudinal axis 1006 between opposite semiconductor facets 1008, 1010. A pair of refractive index elements 1012a, 1012b are adjacent to at least a portion of the waveguide section 1004 so as to provide lateral index-guided beam propagation in the waveguide section 1004 at least proximate the semiconductor facet 1010. In various examples, the refractive index elements 1012a, 1012b can extend from (or from near) the semiconductor facet 1010 to a waveguide transition plane 1014, prior to the transition plane 1014 and adjacent the waveguide section 1004, or past the transition plane 1014 and adjacent the waveguide section 1002. The waveguide region without the adjacent refractive index elements 1012a, 1012b, such as the waveguide section 1002, typically has a lateral refractive index profile corresponding to gain-guided beam propagation.

In some examples, a laser oscillator is formed between the semiconductor facet 1008, coated with a high-reflectivity high reflector coating, and the semiconductor facet 1010, coated with a partial reflector coating. In further examples, the semiconductor facet 1010 is anti-reflectivity coated to reduce oscillation and the transition plane 1014 includes a reflectivity so that the waveguide section 1002 forms a master oscillator and the waveguide section 1004 forms a power amplifier. In representative embodiments, the waveguide section 1002 is a single-mode or few-mode oscillator, and the gain-guided propagation in the waveguide section 1002 allows a higher seed power with a single or few modes coupled to the amplifier region of the waveguide section 1004, improving efficiency of the amplifier region. The different index-guided and gain-guided regions can be used to decrease a lateral slow axis divergence angle in an output beam 1016 emitted from the semiconductor facet 1010. In further examples, grating elements 1018 can be situated in the waveguide section 1002 that are also laterally gain-guided and that extend less than the full length of the waveguide section 1002 so as to correspond to a distributed Bragg reflector or that extend the full length of the waveguide section 1002 so as to correspond to a distributed feedback grating. The grating elements 1018 can also be situated in or extend into the waveguide section 1004.

Figure 11:
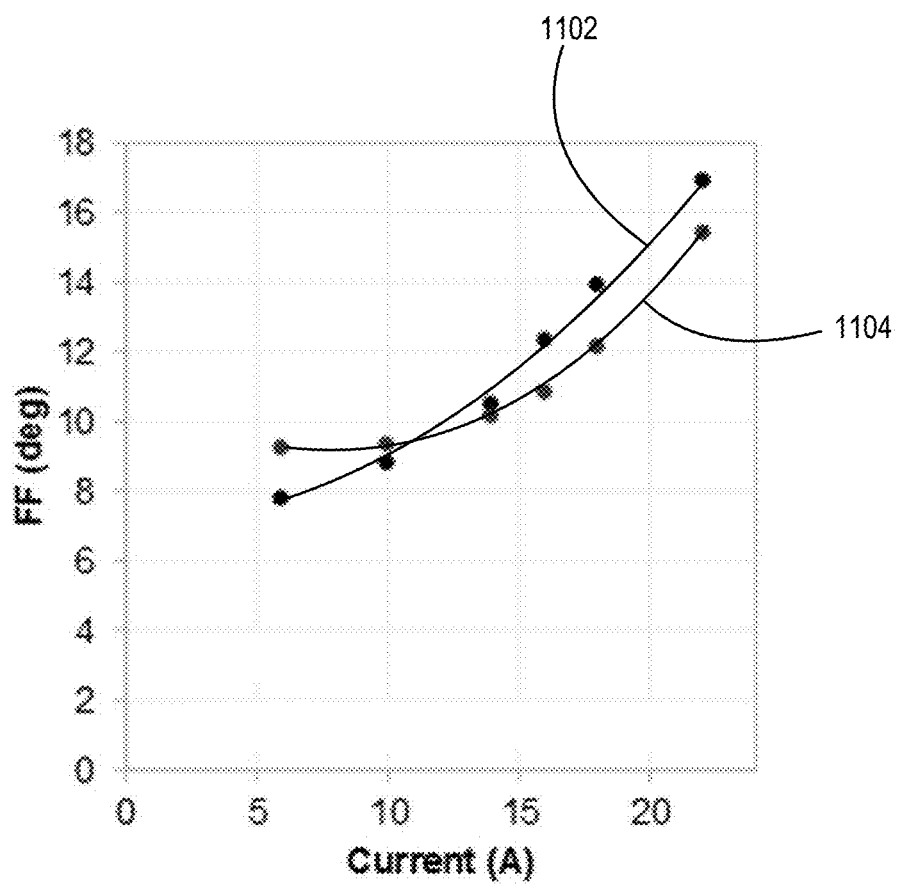
FIG. 11 is a graph of output beam far field divergence versus current.

The graph of FIG. 11 depicts the experimental performance curves 1102, 1104 comparing the far field divergence angle of an output beam with respect to injected current for two different semiconductor devices. The experimental performance curve 1102 corresponds to the operation of the semiconductor laser 100 (shown in FIGS. 1A-1C) and the curve 1104 corresponds to the operation of the semiconductor laser 600 (shown in FIG. 6). The semiconductor laser 600 produces an improved, lower far field divergence angle from approximately 11 A to 23 A. In representative examples, the strongly index-guided ridge waveguide near the front facet does not increase the slow axis far field divergence angle.

Instead, the deep etch helps to improve heat dissipation and reduces lateral thermal gradient, and therefore reduce thermal lensing and further reduce divergence.

Figure 12:
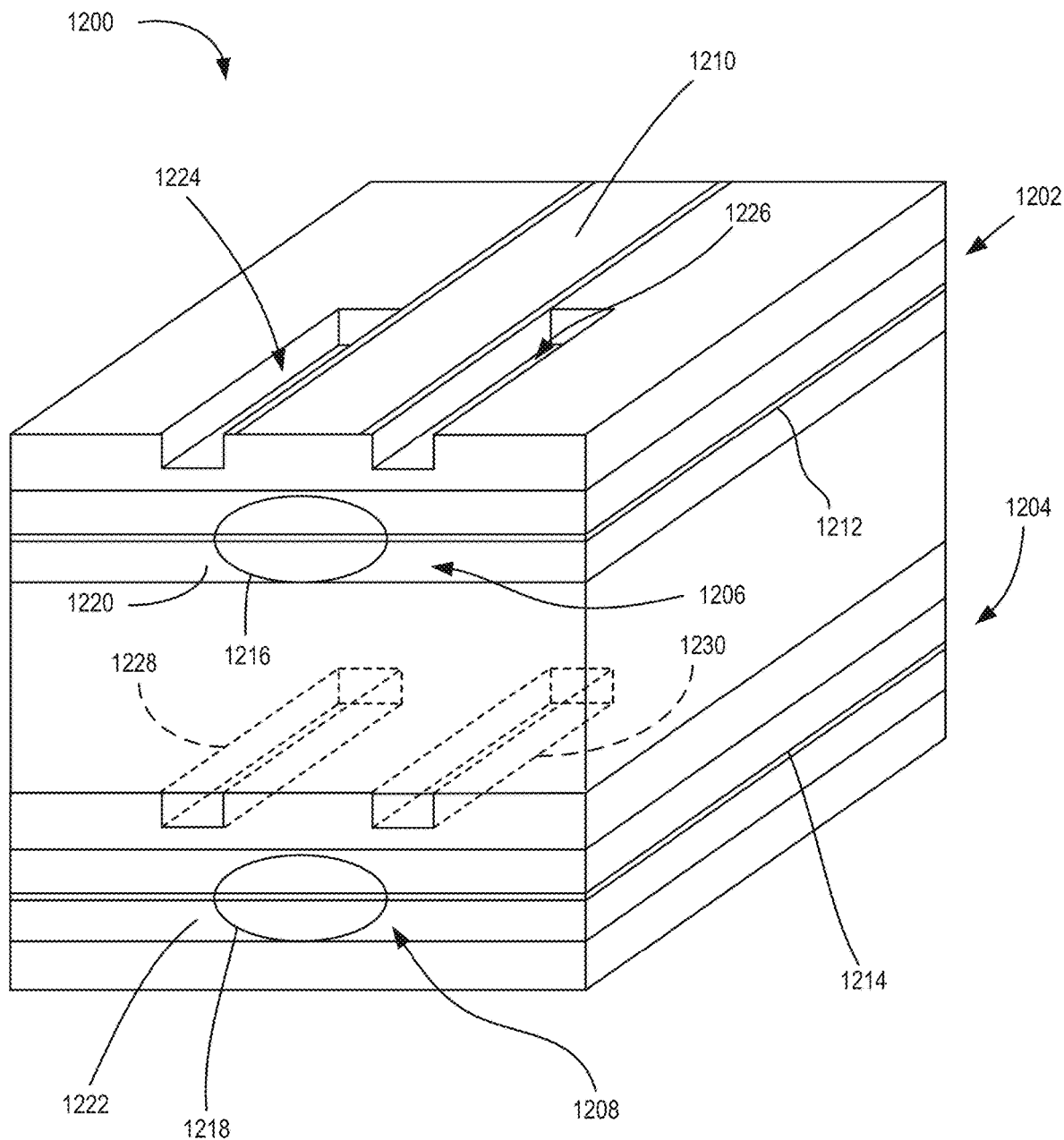
FIG. 12 is a perspective view of a multijunction diode laser example.

FIG. 12 shows an example multijunction semiconductor laser 1200 that includes laser diode junctions 1202, 1204 and corresponding waveguides 1206, 1208. In representative examples, the multijunction semiconductor laser 1200 is formed by growing a plurality of semiconductor layers typically monolithically. The separate junctions 1202, 1204 typically use the same current (vertical in FIG. 12) through a metal contact 1210 that excites respective quantum well layers (or other gain layers) 1212, 1214 so that respective laser beams 1216, 1218 oscillate between HR facets (behind the perspective view in FIG. 12) and PR facets 1220, 1222 and emit from PR facets 1220, 1222.

A pair of refractive index elements 1224, 1226 are situated adjacent to the waveguide 1206 near the PR facet 1220 and extend in a length direction of the waveguide 1206 towards the HR facet. The refractive index elements 1224, 1226 provide a lateral index-guide for the laser beam 1216 propagating in the waveguide 1206 near the PR facet 1220, and the lack of the refractive index elements 1224, 1226 near the HR facet provide a gain-guided propagation for the laser beam 1216 in the waveguide 1206. The variation in lateral refractive index difference along the length of the laser diode junction 1202 reduces a lateral (slow axis) divergence angle for the laser beam 1216 emitted from the PR facet 1220. A pair of lateral refractive index elements 1228, 1230 can be buried within the multijunction semiconductor laser 1200 and situated adjacent to the waveguide 1208. The refractive index elements 1228, 1230 have a suitable refractive index (e.g., air, semiconductor, or dielectric) so as to provide a lateral refractive index difference for the waveguide 1208 near the PR facet 1222 that provides index-guided propagation for the laser beam 1218. The shape and length of the refractive index elements 1228, 1230 can be the same or different from the refractive index elements 1224, 1226.

Figure 13:
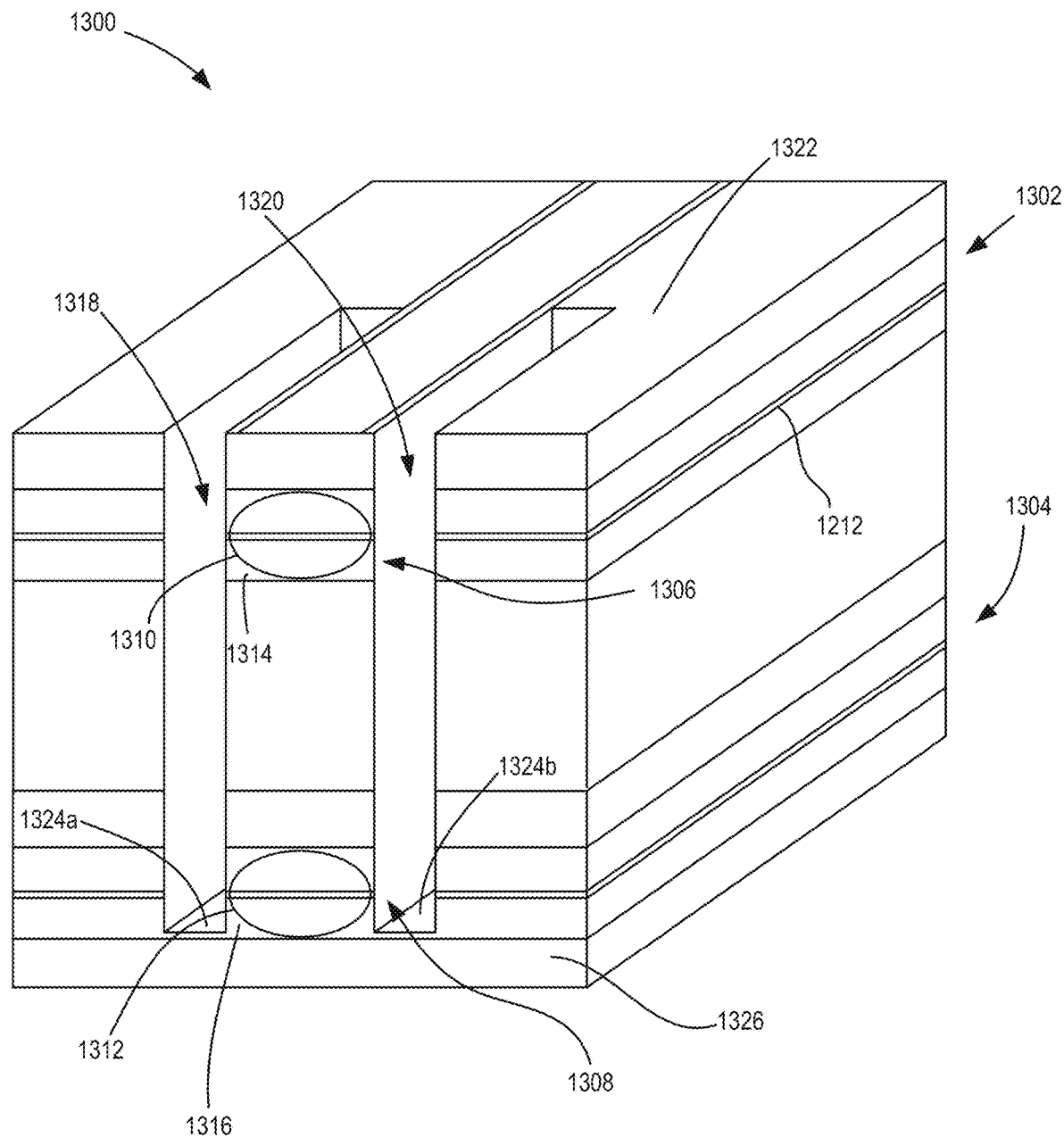
FIG. 13 is a perspective view of another multijunction diode laser example.

FIG. 13 depicts an example multijunction semiconductor laser 1300 that includes laser diode junctions 1302, 1304 and corresponding waveguides 1306, 1308. Respective laser beams 1310, 1312 are generated in the waveguides 1306, 1308 between respective high reflectors and respective output facets 1314, 1316 and emitted from the output facets 1314, 1316. A pair of lateral refractive index elements 1318, 1320 can be situated proximate the output facets 1314, 1316 and be provided with a depth that extends from a top surface 1322 passed the waveguide 1306 to the waveguide 1308. The depth of the bottom surfaces 1324a, 1324b can be at, above, or below an n-type layer 1326, typically proximate the waveguide 1308. In representative examples, the surfaces 1324a, 1324b have a common plane but they can also have different depths, parallel, asymmetric, etc. Also, any of the other configurations described in the various examples discussed hereinabove can also be implemented. In some examples, three or more junctions form a multijunction diode laser. The lateral waveguides 1306, 1308 can be strongly index guided by the refractive index elements 1318, 1320 near the output facets 1314, 1316 so as to provide a well-defined slow-axis near field, particularly for the waveguide 1308 that is buried in the multijunction semiconductor laser 1300, without increasing the slow axis divergence angle of the laser beams 1310, 1312. Such performance can be contrasted with the larger divergence angles in multijunction semiconductor lasers that include a strong index-guiding ridge along the full length of the diode laser, where the large lateral index of refraction step can support many higher order modes.

Figure 14:
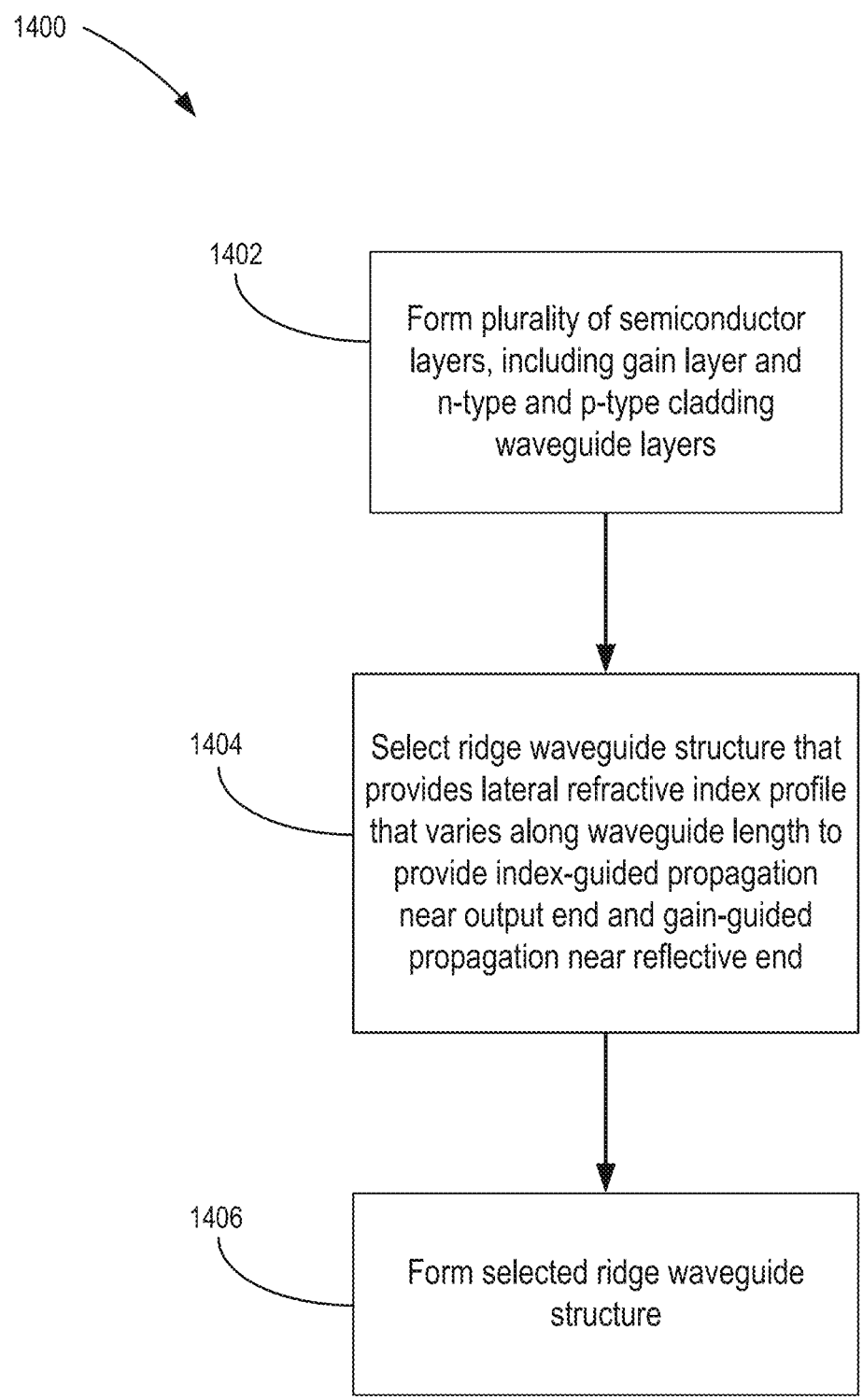
FIG. 14 is a flowchart of an example method of forming a semiconductor device.

FIG. 14 shows a method 1400 of forming a semiconductor laser device. At 1402, a plurality of semiconductor layers are formed including a gain layer situated between n-type and p-type cladding waveguide layers. At 1404, a ridge waveguide structure is selected that provides a lateral refractive index profile for the waveguide layers so as to define opposite sides of a broad area laser cavity. The ridge waveguide structure is also selected such that the lateral refractive index profile varies along a length of the waveguide so as to provide index-guided beam propagation nearer an output end of the waveguide and gain-guided beam propagation nearer a reflective end of the waveguide. The variation in the lateral refractive index profile provides a reduced slow axis divergence angle for the output beam emitted from the output end. At 1406, the ridge waveguide structure is formed by one or more of etching and/or selectively growing semiconductor and/or dielectric layers.

In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of devices described herein may be combined in function and use, such as the various types of refractive index elements described. We therefore claim all that comes within the scope and spirit of the appended claims.

We claim:

1. An apparatus, comprising:
   a semiconductor waveguide extending along a longitudinal axis and including a pumped first waveguide section and a second waveguide section, wherein a lateral refractive index difference defining the semiconductor waveguide is larger for the first waveguide section than for the second waveguide section; and
   an output facet situated on the longitudinal axis of the semiconductor waveguide to emit a laser beam propagating in the semiconductor waveguide, wherein the first waveguide section is situated between the second waveguide section and the output facet and wherein the lateral refractive index difference suppresses emission of higher order transverse modes in the laser beam emitted by the output facet.

2. The apparatus of claim 1, wherein the lateral refractive index difference of at least a portion of the first waveguide section defines a lateral index-guiding region and wherein the lateral refractive index difference of at least a portion of the second waveguide section defines a lateral gain-guiding region.

3. The apparatus of claim 1, wherein the lateral refractive index difference of at least a portion of the first waveguide section defines a lateral index-guiding region and wherein the lateral refractive index difference of at least a portion of the second waveguide section defines a lateral weak index-guiding region.

4. The apparatus of claim 1, wherein the lateral refractive index difference in the first waveguide section is constant along the longitudinal axis and the lateral refractive index difference in the second waveguide section is constant along the longitudinal axis.

5. The apparatus of claim 1, wherein the lateral refractive index difference decreases monotonically in the first waveguide section and through the second waveguide section.

6. The apparatus of claim 1, further comprising:
a high reflector facet opposite the output facet;
wherein the output facet is a partial reflector facet that defines a laser oscillator between the high reflector facet and the partial reflector facet.

7. The apparatus of claim 6, wherein the first waveguide section adjoins the partial reflector and the lateral refractive index difference of the first waveguide section defines an index-guiding region, wherein the second waveguide section adjoins the high reflector the lateral refractive index difference of the second waveguide section defines a gain-guiding region.

8. The apparatus of claim 1, wherein a lateral width of the semiconductor waveguide tapers in a direction away from the output facet along the longitudinal axis.

9. The apparatus of claim 1, wherein the lateral refractive index difference corresponds to a lateral refractive index profile including a middle refractive index portion corresponding to an interior region of the semiconductor waveguide and opposite side refractive index portions corresponding to opposite lateral regions adjacent to the interior region.

10. The apparatus of claim 9, wherein the middle refractive index portion is defined by a ridge structure.

11. The apparatus of claim 9, wherein the opposite lateral regions include index elements that extend longitudinally along the semiconductor waveguide adjacent to the interior region and that define the side refractive index portions.

12. The apparatus of claim 11, wherein the index elements comprise air, dielectric, or semiconductor material.

13. The apparatus of claim 11, wherein the index elements are curved such that a first length portion further from the output facet along the longitudinal axis is more spaced apart from the longitudinal axis than a second length portion that is closer to the output facet along the longitudinal axis.

14. The apparatus of claim 13, wherein the curving defines a waveguide section situated to provide an adiabatic modal transition between index-guiding and gain-guiding.

15. The apparatus of claim 11, wherein the index elements extend longitudinally adjacent to the interior region of the first waveguide section and do not extend longitudinally adjacent to the interior region of the second waveguide section.

16. The apparatus of claim 15, wherein the index elements in the first waveguide section include an etch depth at or below a lateral emission axis of the emitted laser beam.

17. The apparatus of claim 11, wherein the index elements include an etch depth that decreases with increasing distance from the output facet along the longitudinal axis.

18. The apparatus of claim 17, wherein the etch depth at the output facet is at or below a lateral emission axis of the emitted laser beam.

19. The apparatus of claim 17, wherein the index elements include a longitudinally varying width that is associated with the decrease of the etch depth.

20. The apparatus of claim 6, further comprising index elements situated opposite an interior region of the semiconductor waveguide and extending longitudinally along and adjacent to the semiconductor waveguide with an etch depth that varies from a first depth at the output facet to a second depth smaller than the first depth at the high reflector to define opposite lateral side refractive index portions of the lateral refractive index difference.

21. The apparatus of claim 20, wherein the second depth is a zero etch depth.

22. The apparatus of claim 1, wherein the refractive index difference varies at a cross-section of the semiconductor waveguide based on an amount of current injection through the semiconductor waveguide at the cross-section.

23. The apparatus of claim 1, wherein the semiconductor waveguide is a master oscillator power amplifier (MOPA) with the first waveguide section corresponding to the power amplifier of the MOPA and the second waveguide section corresponding to the master oscillator of the MOPA.

24. The apparatus of claim 1, wherein the first waveguide section includes at least a portion with a lateral width that tapers in a direction away from the output facet along the longitudinal axis, and wherein the second waveguide section includes at least a portion having a constant lateral width along the longitudinal axis to define a single or few lateral transverse mode waveguide.

25. The apparatus of claim 1, further comprising a second semiconductor waveguide monolithically spaced apart from the semiconductor waveguide in a semiconductor growth direction to define a multijunction diode laser.

26. The apparatus of claim 25, further comprising a first pair of refractive index elements adjacent to the semiconductor waveguide to provide the lateral refractive index difference and a second pair of refractive index elements adjacent to the second semiconductor waveguide to provide a second lateral refractive index difference that also suppresses emission of higher order transverse modes in a laser beam emitted from the second semiconductor waveguide.

27. The apparatus of claim 25, further comprising a pair of lateral refractive index elements that extend in the semiconductor growth direction to be situated adjacent to the semiconductor waveguide and the second semiconductor waveguide and to provide the lateral refractive index difference.

28. An apparatus, comprising: a semiconductor laser including a high reflector and a partial reflector, an index guided region proximate the partial reflector that supports lateral higher order modes, and a gain guided region proximate the high reflector that suppresses the lateral higher order modes supported by the index guided region.

29. A method, comprising:
forming a semiconductor laser including a plurality of semiconductor layers including n-type and p-type cladding waveguide layers and a gain layer situated between the cladding waveguide layers, wherein the plurality of semiconductor layers define a lateral refractive index difference that varies along a length of the semiconductor laser to define a lateral index-guided region nearer to an output facet of the semiconductor laser and a lateral gain-guided region nearer to a high reflector facet of the semiconductor laser and to reduce a lateral divergence beam in a laser beam emitted from the output facet.

* * * * *